United States Patent [19]
Aronstein et al.

[11] B 3,995,206

[45] Nov. 30, 1976

[54] APPARATUS FOR TRANSFERRING ARTICLES THROUGH VARIOUS PROCESSING SECTORS OF A MANUFACTURING SYSTEM

[75] Inventors: Jesse Aronstein; Arkady Leoff, both of Poughkeepsie; John J. Murphy, Fishkill; Winfield S. Ruder, Wappingers Falls, all of N.Y.

[73] Assignee: International Business Machines Corporation, Armonk, N.Y.

[22] Filed: June 6, 1974

[21] Appl. No.: 476,967

[44] Published under the second Trial Voluntary Protest Program on March 9, 1976 as document No. B 476,967.

Related U.S. Application Data
[62] Division of Ser. No. 319,563, Dec. 29, 1972.

[52] U.S. Cl. ............................. 318/593; 318/467; 318/594; 318/614; 318/653
[51] Int. Cl.$^2$ .................................... G05B 11/18
[58] Field of Search .......... 318/467, 593, 594, 614, 318/653

[56] References Cited
UNITED STATES PATENTS

| | | | |
|---|---|---|---|
| 2,798,992 | 7/1957 | Adler et al. | 318/593 |
| 3,209,221 | 9/1965 | Pugsley et al. | 318/593 X |
| 3,222,637 | 12/1965 | Gray | 318/593 X |
| 3,339,122 | 8/1967 | Sangster | 318/594 X |
| 3,504,245 | 3/1970 | Cotton et al. | 318/594 X |
| 3,689,820 | 9/1972 | Takegawa | 318/594 |
| 3,719,879 | 3/1973 | Marcy | 318/593 |
| 3,760,249 | 9/1973 | Connors | 318/653 X |
| 3,775,837 | 12/1973 | Tomita et al. | 318/593 X |

*Primary Examiner*—G. Z. Rubinson
*Assistant Examiner*—John J. Feldhaus
*Attorney, Agent, or Firm*—Henry Powers

[57] ABSTRACT

A material transfer apparatus which includes a carriage whose movement is controlled along a path between specified locations thereon. The carriage includes means for dynamically indicating its present location on the path which is compared with a specified new location to provide a difference drive for moving the carriage as required.

6 Claims, 19 Drawing Figures

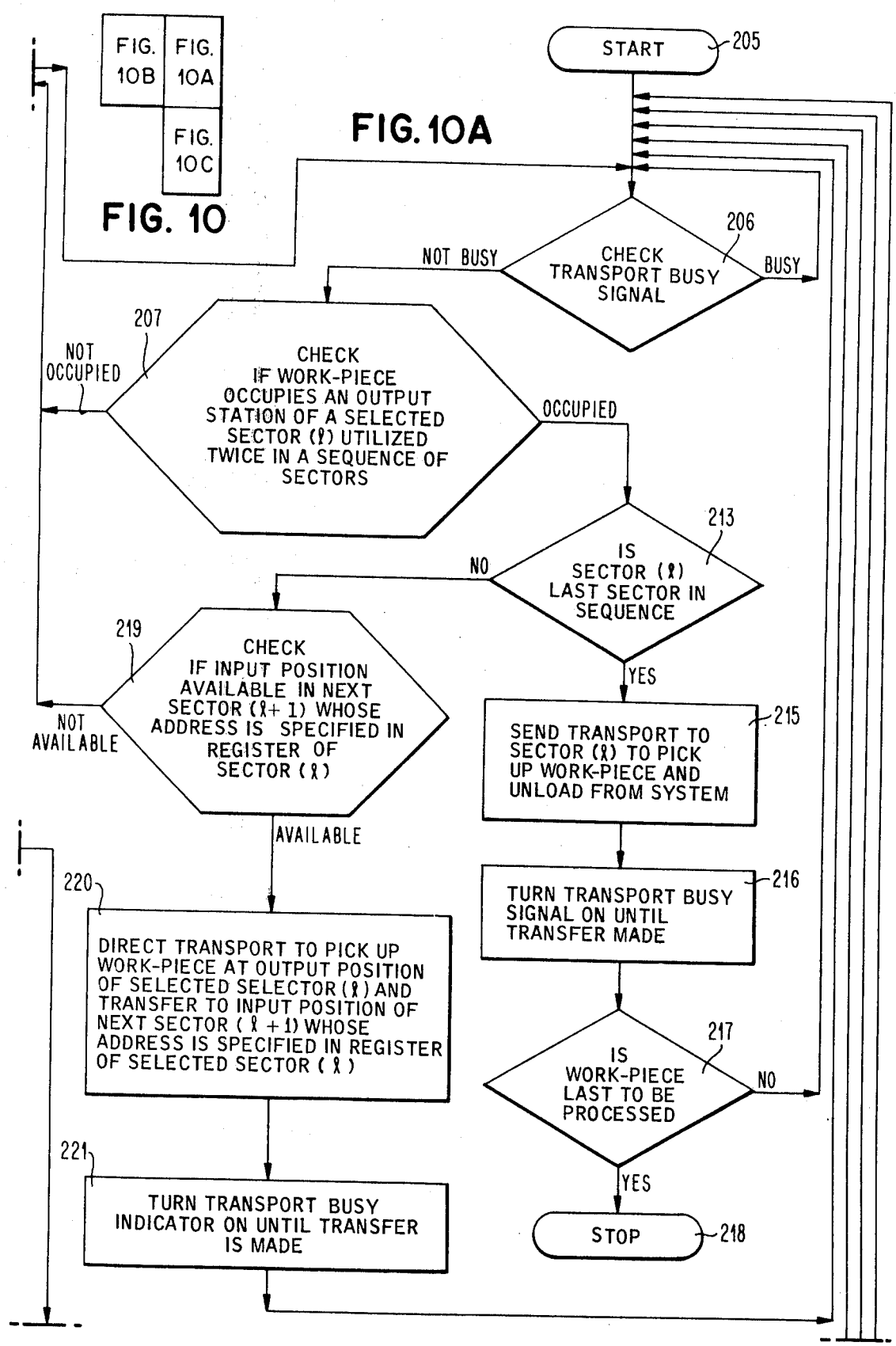

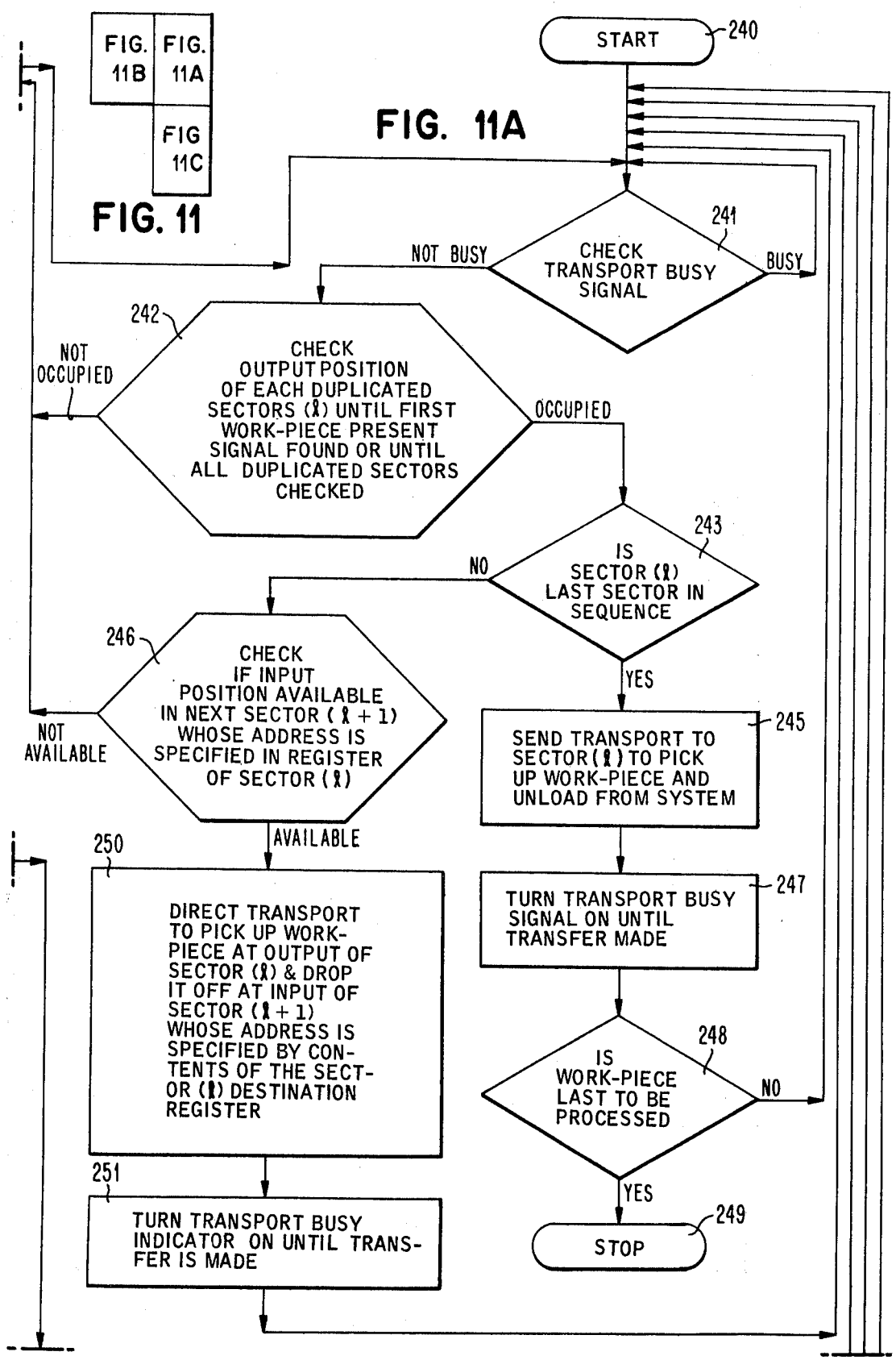

APPARATUS FOR TRANSFERRING ARTICLES THROUGH VARIOUS PROCESSING SECTORS OF A MANUFACTURING SYSTEM

This is a division, of application Ser. No. 319,563 filed Dec. 29, 1972.

FIELD OF THE INVENTION

This invention relates to work handling apparatus, and more particularly to a carrier system for transfer of articles along a path through a prescribed sequence of locations at which may be located processing sectors to perform specified operation on the article or material as required in an overall processing schedule.

BACKGROUND OF THE INVENTION

This invention was developed for use in the Continuous Processing System disclosed and described in copending U.S. application Ser. No. 319,563 filed 12/29/72, now U.S. Pat. No. 3,850,105 which utilizes a plurality of satellite functional processing operations each capable of stand-alone operation. This copending application is assigned to the assignee of this application.

As disclosed in the aforesaid U.S. Pat. No. 3,850,105, its manufacturing system is partitioned into functional parts or sectors. Each part consists of a set of process steps designed so that before and after which, the work product may be stored for some period of time without degradation in product quality of expected yield. The reason for partitioning the process this way is to allow accommodation of equipment failure and repair.

The process sectors are comprehended as stand-alone independent processing plants which accomplish a set of process steps and may have a temporary product storage unit at the output end. Work-pieces are brought to the input port of a sector by a central transport unit such as that disclosed in accordance with this invention. Upon sensing the presence of a work-piece at the input port, the sector controls cause the units to be processed through the entire sequence of steps in that sector, and after passing, optionally, through an output buffer to an output port for pickup by the central transport. In accordance with well known techniques, measurements are provided within a sector to allow confirmation of proper operation of tools within the sector and in some cases where desired, to provide send-ahead information for adaptive process controls to be applied in subsequent process sectors. Each of the sectors is also envisioned to be under suitable control, either by general purpose computer or a hardwired system, to specify and maintain process parameters, and to maintain proper flow of work-pieces for the sector.

SUMMARY OF THE INVENTION

The central transport system as comprehended in this invention comprises one or more mobile work-piece carriers which can be commanded to pick up a work-piece from the output port of one sector and bring it to the input port of another sector. The central transport is operated under a control system which can be pre-programmed to specify the required sequence of sectors through which the work-piece is to be transported so that it may undergo a prescribed sequence of processing operations. Logistic control is also comtemplated to be employed to enable either the same or different work-pieces to be processed on a first-in first-out sequence. In operation the control system enables the transport to travel to any of the input or output pedestals of a prescribed sequence of selected sectors for pickup or delivery of the work-piece as required by the processing schedule.

Normally, in the overall manufacturing system of U.S. Pat. No. 3,850,105, the work-pieces will enter the system via a loader built into the overall system or into the initial process sector which will perform an initial set of operations on the work-piece. Upon arrival at the output pedestal of that sector, the central transport handler will be commanded to pickup the work-piece and deliver it to the next (process sequence-wise) process sector, provided that the next sector is known to be in operating condition. Upon arrival at the next sector, the work-piece will be taken through its series of process steps with arrival at an output pedestal for transport to the next sector in the prescribed sequence of sectors.

Repeating this throughout the line, each work-piece is taken in sequence through the manufacturing steps from start to finish. The intra-sector work-piece flow can normally be accomplished by local controls which may be dedicated to each sector. Each sector therefore operates as a machine independent of the others. This mode of operation provides for fail-soft operation, independent installation and debug of process sectors, featureability of additional process sectors, and accommodation of sector outage due to the equipment failure.

A more complete understanding of the invention may be had by reference to the following more detailed description taken in conjunction with the accompanying drawings.

DESCRIPTION OF PREFERRED EMBODIMENTS

Figure 1:
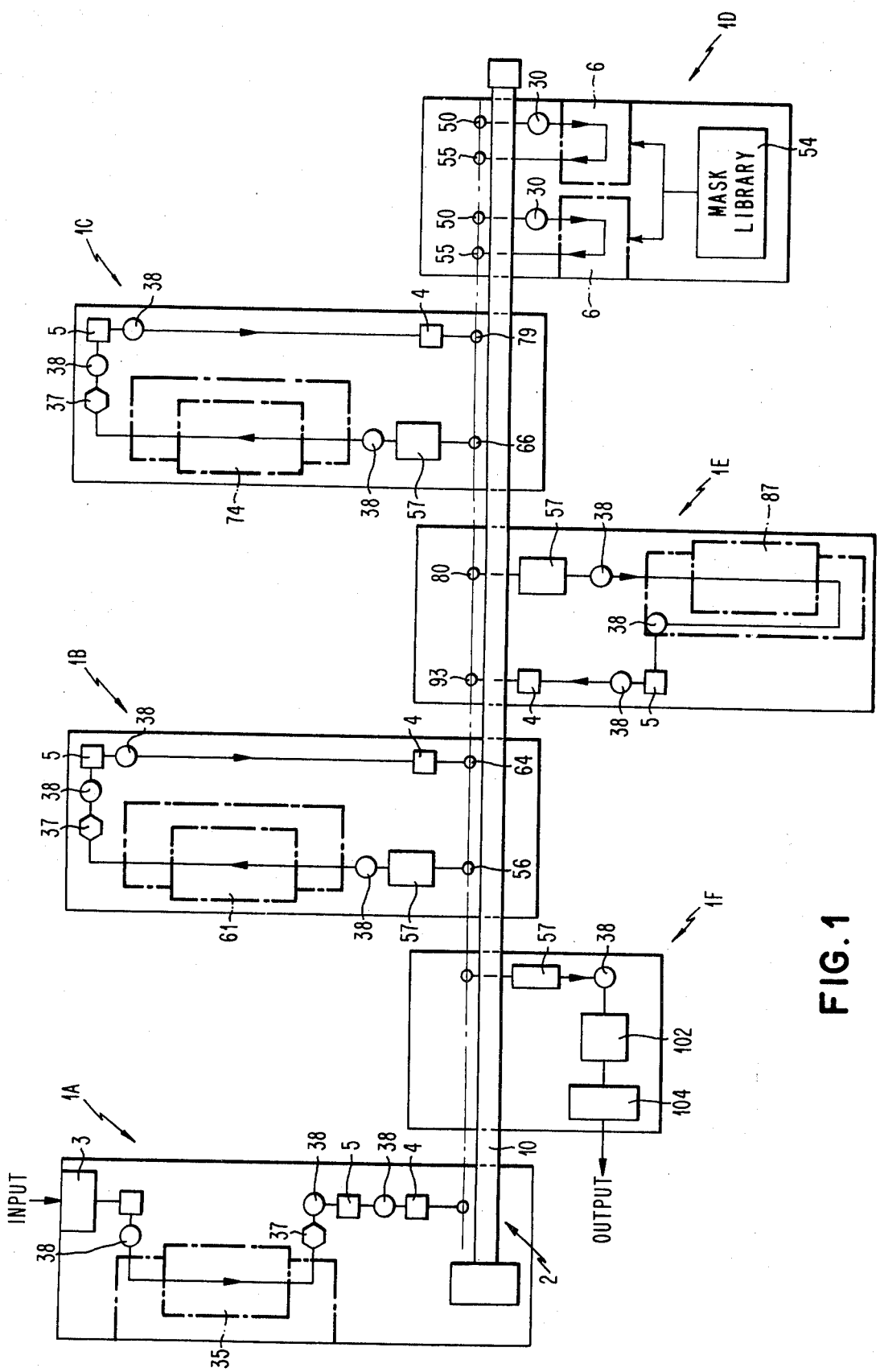
FIG. 1 is a diagrammatic representation in plan view of a manufacturing system embodying the principles of the invention of this application.

Referring to FIG. 1, a manufacturing system is shown whose overall processing operations are partitioned, in accordance with the aforesaid U.S. Pat. No. 3,850,105, into independent stand-alone processing stations or sectors 1A to 1F, each sector comprising a set of processing steps before and after which the product may be stored for some period of time without degradation in product quality or expected yield. Each of these processing sectors 1A to 1F are in effect independent stand-alone manufacturing plants which accomplish a set of processing steps, and which may have a temporary product storage unit at the output end. Although only six processing sectors are illustrated, it is to be understood that as many sectors as may be required to accommodate the total output of a plant, may be employed from which their preselection and sequencing effected by means of suitable control units well in the known art for controlling the transfer of a work-piece between the various sectors by a central transport unit or conveyor, generally indicated by numeral 2.

In operation, work-pieces are brought to the input port or loading position of each sector by the central transport unit 2. Upon sensing the presence of a work-piece at an input port or position, the controls of that process sector cause the work-piece to be processed through the entire sequence of steps incorporated in that particular sector, and after passing through the processing operation of that sector, the work-pieces are brought to the output port of that sector for pickup by the central transport for transportation and transfer to the next required sector in a prescribed sequence of work sectors specified by the control unit regulating movement of transport 2.

The central transport 2, as disclosed in accordance with this invention, may include one or more mobile work-piece carriers which can be commanded to pick up a work-piece such as a semiconductor wafer from the output port or unloading position, of one sector and bring it to the input port of any other specified sector. Normally, as further described below, a servo control enables the transport to travel to any of the input or output ports or station of the various sectors for pickup or delivery of a work-piece as directed by the control unit.

Where the manufacturing system of this invention is adapted to the manufacture of semiconductor devices, each of the work sectors 1A to 1F will have all the tooling required for effecting one or more semiconductor processing operation assigned to the sector, as for example epitaxial growth, metallization, photoresist application, photoresist pattern exposure, photoresist development, oxide etching, photoresist stripping, impurity diffusion, impurity drivein, metal etching, formation of dielectric coatings, sputtering, ion implantation, photoresist coating operations, and the like.

For purposes of illustrating a typical semiconductor manufacturing system, the system of FIG. 1 may be correlated to the production of field effect transistor circuits. In such applications, the system will contain all the tooling required for producing the field effect transistors circuits, inclusive from raw wafer through aluminum sinter. For production of field effect transistor circuits, the system will include an initial oxidation sector 1A; a source and drain deposition sector 1B; a gate oxidation sector 1C; a pattern generating sector 1D; a metallization sector 1E; and a sintering sector 1F. Except for the align and expose units in the pattern generating sector 1D sectors, the tooling in each of the remainder sectors will be directed for each processing series of steps. Normally, single wafers will enter the system at a gated rate and proceed through the sectors on a first-in first-out basis. Preferably, buffering will be provided at the output ports of sectors 1A, 1B, 1C and 1E to accommodate any subsequent equipment unreliability. Although the buffer unit in each sector may take any desired configuration, a typical one can be exemplified by that described in co-pending application U.S. Ser. No. 203,374 filed Nov. 30, 1971, and assigned to the assignee of this application.

Wafers can be fed into the system via any suitable loader 3 built into the initial sector, e.g. initial oxidation station 1A, which sector will generally perform a set of cleaning operations, growth of an oxide on the wafer, and the application of a layer of photoresist material over the oxide coating.

In addition, it is to be noted that photoresist apply-and-dry and developed-etch-strip operations are coupled into the appropriate hot process sectors to enhance adhesion and cleanliness. These parts of the photolithographic operations are distributed through a line in a manner designed to maximize yield and minimize control complexity.

Align and expose apparatus is common for all levels, although the featureability of this system allows the use of various methods where justified for yield, cost, etc.

The various sectors are connected by a central transport system 2 such as disclosed in this invention which will include a wafer handler which can pick up a wafer from one sector and deposit it at another. The handler operates on one wafer at a time for sake of mechanical and control simplicity. In this specific FET processing operation shown, the wafer will be transferred eight times during complete processing.

The processing sectors 1A to 1F are grouped around the handler as satellite stations so as to simplify the facility. Hot processing sectors are grouped in one area, align-and-expose sections at another, thus facilitating the installation and maintenance of specific environments and services required for each type of tool. For example, the aligned and expose equipment may require an air-conditioned enclosure, whereas the hot processing equipment may require exhaust ventilation.

The manufacture system includes four main buffers one at the output of each hot process sector, e.g. initial oxidation sector 1A; source and diffusion deposition sector 1B; gate oxidation sector 1C; and metallization sector 1E. There is normally no need for buffers at the output of the pattern generators unit 6 in the resist exposed sector 1B, since their internal capacity is only one wafer. Provision may be made however for a one wafer buffer capability at the input to any of the developed-etch-strip operations of the other sections to allow for the possibility that an associated sector may go down while a wafer destined for it is in the align and expose stations. As will be obvious, it is desirable to clear the pattern generating units 6 in the expose sector 1B so that other levels can still be processed.

Temporary wafer storage buffers 4 are placed at points in the process where storage time does not effect yield, as for example, after the resist apply-and-dry units 5 (in work sectors 1A, 1B, 1C, and 1E) which operation is employed prior to the aligned and exposed operation in the pattern generating units 6 of the resist expose sector 1D. In practice the manufacturing system will be designed with a built-in over capacity of all processing sectors to allow queues to be absorbed after a down-sector is repaired. Operation of the overall manufacturing system is asynchronous; each work sector or sub-sector to operate on a wafer as soon as it arrives, until its maximum repeat rate is reached.

The first-in first-out one-wafer at a time operation makes it relatively simple to contain a part number mix problem. A large variety of different part numbers can be processed using a minimal production control support system to track wafers within the line. In a production system of this type with a high part number mix, wafer serial and/or part number identity can be verified prior to any of the last three align and expose steps. This can be done during transit in the wafer handler of the central transport unit 2 by relatively simple equipment and state-of-the-art technique.

Illustrative of such part mix processings, is the fabrication of an interspersed flow of different part numbers of a family of wafers in which the processing parameters of the various processing sectors, with the exclusion of the pattern generators 6, are substantially the same. In this respect, personalization of the various part numbers is affected by suitable reading of the wafer serial and/or part number, to select the appropriate pattern or mask to be employed by a pattern generator 6 for exposing the resist coated wafers at their various levels of processing corresponding to the particular part number of the product mix flow.

Figure 2:
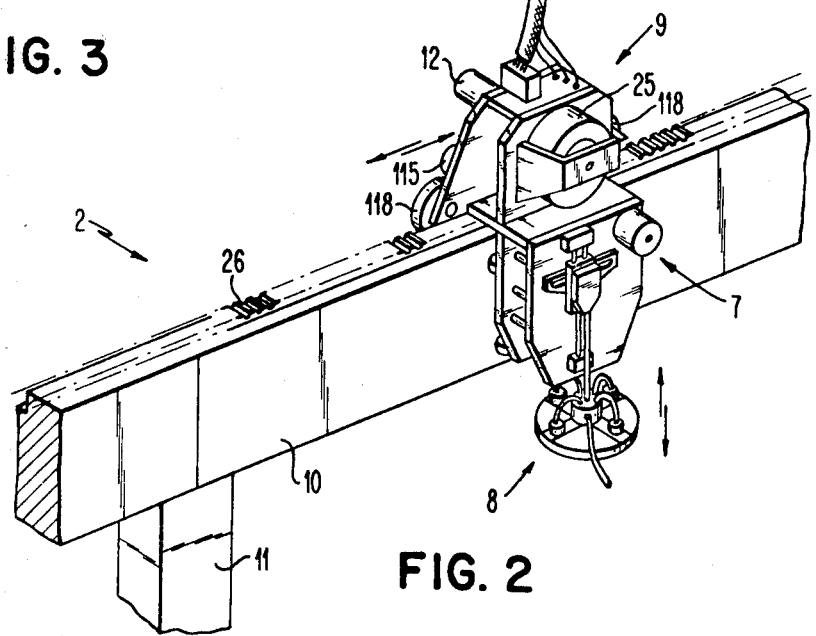
FIG. 2 is a diagrammatic representation in perspective of a transport system suitable for use in the manufacturing system discussed in this invention.

The central transport system 2 as disclosed herein can comprise one or more mobile wafer carriers 7 which will include a wafer pickup and release mechanism 8 on a carriage 9 which travels along a guide rail 10 as illustrated in FIG. 2. As shown in the drawing pedestals or columns 11 support the guide rail 10 above the load and unload pedestals of the various process sectors or stations. In general, input and output positions of all process sectors are on a common line below the guide rail. Wafers are picked up, carried, and deposited in a horizontal face-up position.

Figure 3:
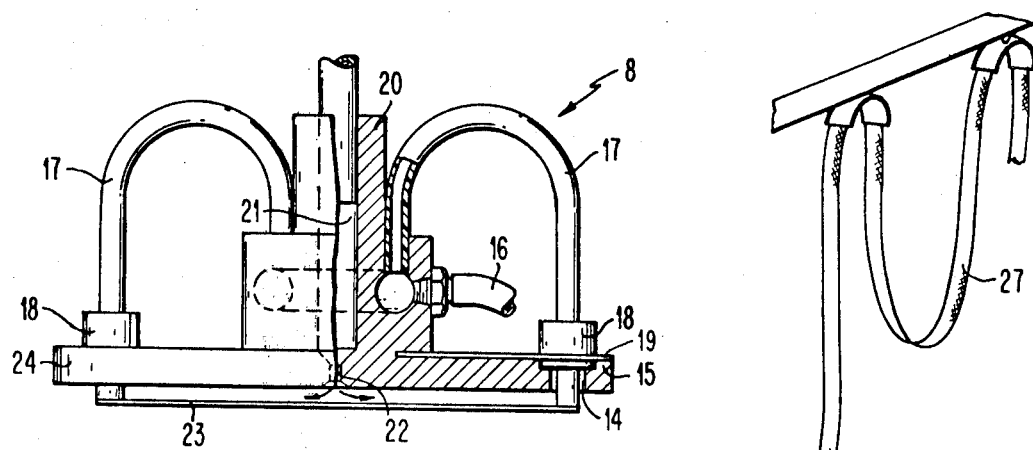
FIG. 3 is an elevational view, partly in section, of a wafer chuck which can be employed in association with the transport system of FIG. 2.
Figure 8:
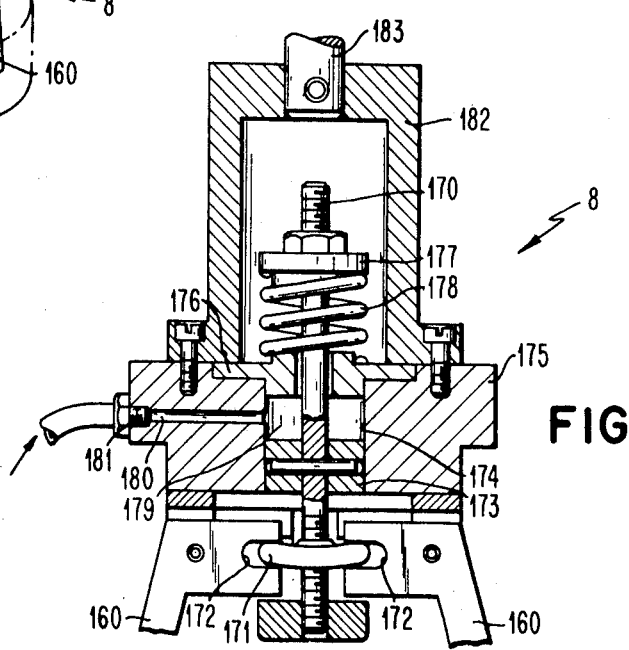
FIG. 8 is an elevational view partly in section illustrating details of a wafer carrier incorporated in the preceeding figures.

Wafer pickup can be accomplished by a version of the Bernoulli probe, such as shown in FIG. 3 as part of the wafer lifter mechanism, or preferably the wafer pick-up can be of the type shown and described with reference to FIG. 8 herein. In one form the wafer pickup 12 illustrated in FIG. 3 comprises a base plate 15 formed with a plurality of peripheral apertures 14 through which are mounted a radial assortment of flexible tubing 17 connected with a vacuum manifold 15 coupled to a source of pressure at the vacuum inputs 16. Mounted about each of the tubings 17 is a yoke unit 18 in which is secured a light leaf spring 19 which is anchored at its other end in the body portion 20 to bias the free ends of the tube 17 uniformly out of the front face of support plate 14 so as to secure a wafer thereto when the vacuum is turned on at an appropriate time. Extending through the body portions 20 is an air passage 21 connected to source of positive gas pressure to reject a source or stream of gas out of the nozzle 22 to provide a Bernoulli effect which will raise a wafer 23 against the open ends of tube 17 for securing a wafer thereto under pressure. As it will be noted, the tubes 17 are spaced about base plate 24 for engagement about corresponding peripheral portions of wafer 23.

In general the carriage assembly 9 comprises the pickup head 8, a Z-motion drive motor 7, a drive motor 25 for driving a pinion gear 120 along a rack 26 secured on the upper surface of support rail 10. In general, information for driving or for controlling the movement of the transport system 2 will be transmitted by means of a service cable 27 extending from a control unit which specifies the selected sequence of process sectors through which the wafer is to be sequenced, which sectors are available for wafer input, senses the presence of a wafer available for pickup at the output of a sector, senses carriage status (availability to pickup a wafer), and senses carriage location. More specific details of the transport are described below.

As indicated previously, the process sectors or stations are configured to accomplish a set of process steps which can be done in a rapid sequence to meet high-yield objective and for this purpose each sector can be optimized to obtain such result. For this reason, the apparatus within each sector is selected on the basis of highest yield potential.

Each sector will also contain adequate timing, motion, and parameter controls to allow for debug and system operation and maintenance. Additionally, an interface can be provided to a control system for data collection, wafer tracking, and where appropriate, overriding computer control of critical parameters in accordance with well established techniques.

Figure 4:
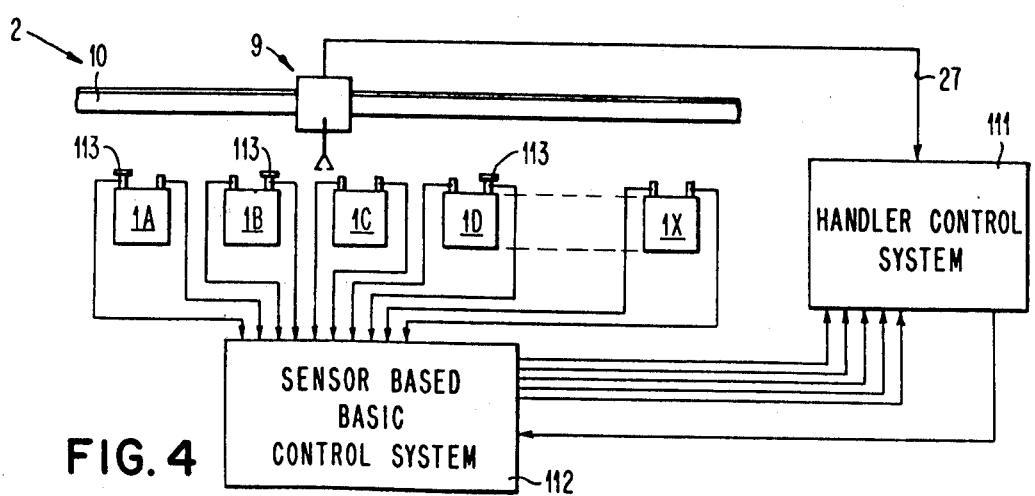
FIG. 4 is a schematic illustration of a control system for use with the transport system in accordance with this invention.

Although the wafer transfer system 2 can take various configuration, the preferred form is in accordance with the invention that is disclosed herein. As described in this application, a schematic overview of this parts handling system is illustrated in FIG. 4. As shown, the central transport system 2 will comprise one or more mobile wafer carriers 9 mounted on a rail 10, with the carrier connected by service cable 27 to a handler control system 111. As indicated above, the central transport system is connected to the control system by a cable, and a series of input and output pedestals of each processing sector or station, as shown in FIG. 4, are distributed along the rail 10 of the transport system. Each of the pedestals associated with the sectors has a "PART PRESENCE" sensor (e.g. photosensor) which sends an electrical signal to a sensor based control system 112, which will perform various functions in the operation of the manufacturing system of this invention, one function of which is to control the movement of parts or work-pieces from pedestal to pedestal of the various processing sectors or stations through which the work-piece is sequenced.

The control system 112 will periodically test for a part 113 present at a pedestal. When one is present at an output or unload pedestal, a series of decisions is made before a move is initiated. The designation "output" might refer to the output or pickup point of a tool or collection of tools. The control system 112 decides which tool a work-piece or part 113 should be moved to next, senses that the "input" pedestal or port of the next tool is available (e.g. no part is currently on it) and sends in an address to handler control system 111. The address sent is that of the output pedestal containing the part 113 to be moved. The handler control system accepts this address and dispatches the carriage 9, from wherever it might currently be located, to the "output/input" pedestal address. The carriage proceeds to this address under control of a servo subsystem (described below). When the move has been completed and the handler 9 has picked up the part, the handler control system 111 sends a movement complete signal back to the control system 112 to inform it that the handler control system is now ready to move to the new address. The control system 112 recalls the input pedestal address to which this part must be moved and sends this address to the handler control system 111, which then proceeds to move the carriage or handler 9 to the specified address. At the completion of this movement, the work-piece 113 will then be transferred to the input of the next work sector or station required in a preselected sequence sector. After this movement, the handler control system 111 again sends a movement complete signal to the control system 112, which now can resume its periodic testing of output pedestals for other parts to be moved.

The wafer handler 9 of the central transport system 2 is comprised of a carriage 7 on which are mounted the main drive motor 25, a vernier or fine positioning motor 12, a coarse positioning potentiometer 115, a fine position sensor 120, a clutch brake 116 and a Z-axis mechanism 117 for raising and lowering the wafer pickup chuck 8. Normally, the carriage will traverse the central transit rail 1 on support rollers 118 and guide rollers 119 with a positive drive through a pinion gear 120 meshing with a gear rack 26. The fine position sensor will comprise a magnetic proximity detector 120 of the "E-transformer" type which is located on the wafer carrier 9 with the actuating bar 121 mounted on the rail 10 at each stopping address of the various processing sectors or stations. This establishes a final stopping point for the carriage 9 in conjunction with minimizing drift and calibration problems and eliminating any type of mechanical contact at the stopping address. A servo demodulator 122 is employed to convert the AC signal from the dector to DC for the use by the fine positioning or vernier motor 12.

The wafer handler 9 is controlled by a two-mode servo mechanism system. This servo mechanism system is shown schematically in FIG. 5. The high speed or coarse position mode utilizes a typical direct current servo with a potentiometer feedback. The low speed or fine position mode utilizes a modified DC servo with a non-contact position sensor 120 which detects a fixed segment on the rail at the stopping point and on which is mounted on the actuating bar 121. There is one fine position sensor 120 on carriage 9 and one fixed actuating bar segment 121 at each pedestal location or stopping address of the various processing sectors or stations.

Also, included on the carriage are the two servo motors, e.g. the main motor drive 25 and the fine positioning or vernier motor 12, the coarse position potentiometer 115 and the Z-motion mechanism 117. Also included in the wafer carriage 9 is the gear and drive mechanism (see FIG. 10) with which is associated electro-mechanical clutch 123 and an electro-mechanical brake 116. The handler controller includes a servo amplifier 123, an address matrix 124 which serves as a digital to analog converter, a coarse position summing amplifier 125, a fine position demodulator 122 which converts a signal from the fine position sensor from AC to DC; and also included are a pair of voltage comparators, e.g. a coarse comparator 126 and a fine comparator 127, plus all required logic and power supplies to run the controller and the carriage.

Figure 5:
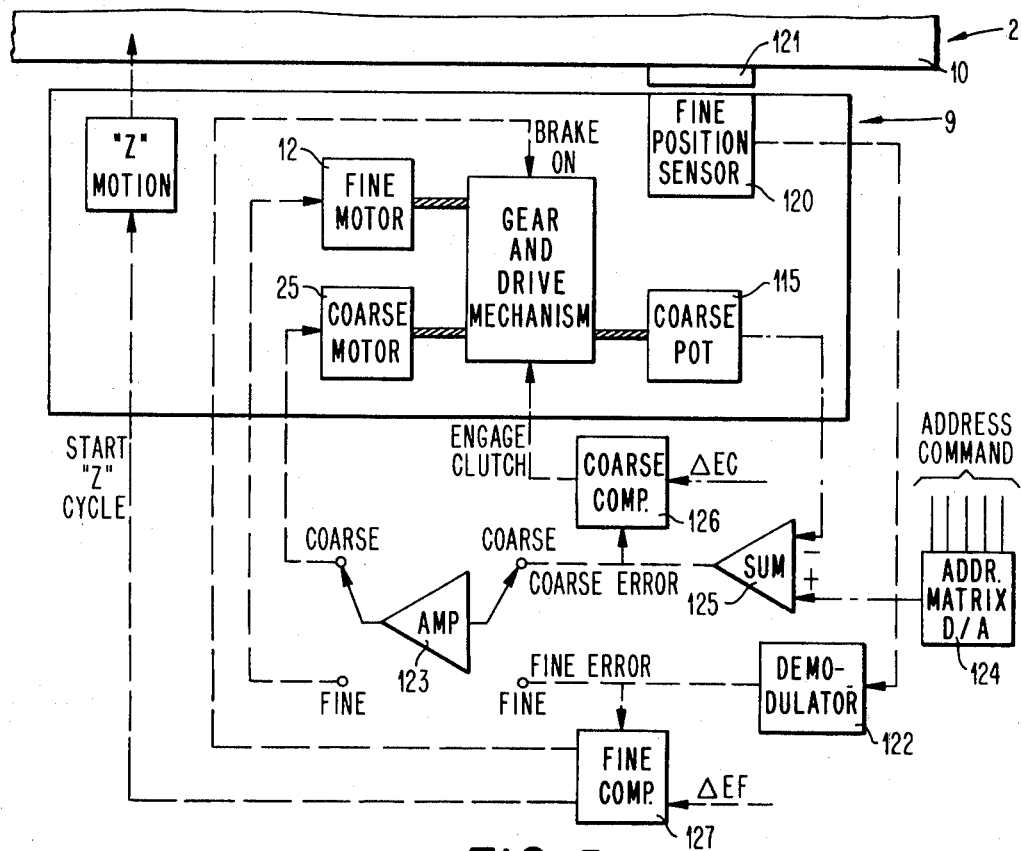
FIG. 5 is a schematic illustration of a control system for a transport system adapted for use in a manufacturing system.
Figure 6:
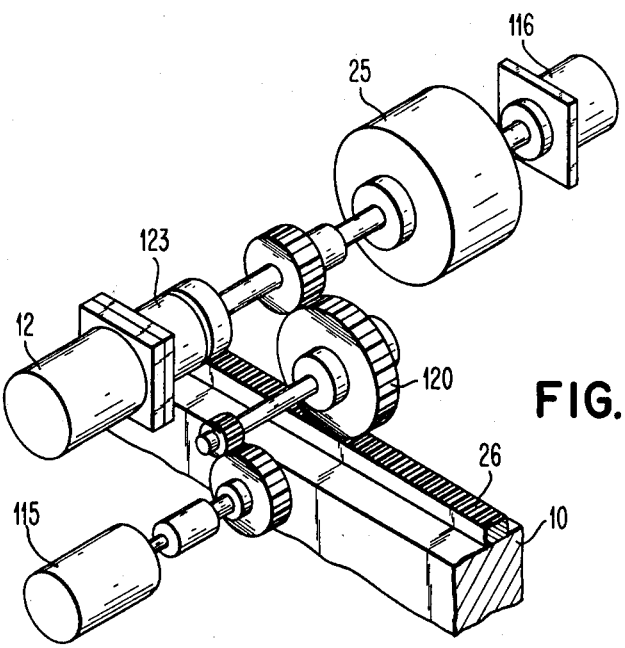
FIG. 6 is an exploded view illustrating details of a transport system shown in the proceeding figures.

With reference to FIG. 5, the operation of the system may be considered relative to the status of the system prior to making a move. At this point in time, the carriage 9 will normally be positioned over some input or output pedestal along the rail 10, the identification of which is of no moment for purposes of this consideration. At this time the brake 116 will be on, locking the carriage 9 to the rail 10. To initiate a movement to a different pedestal, a digital address is placed at the input of the address matrix 124. This generates a voltage or coarse address signal at the positive input of the coarse position summing amplifier 125. The current position of the carriage 9 is represented by the voltage from the coarse position potentiometer 115, which appears at the negative input of the summing amplifier 125. The output of the summing amplifier 125 is a voltage which is proportional to the distance to be moved and of the proper polarity to drive the carriage 9 in the proper direction. At the onset, this error signal exceeds the magnitude of permissive tolerance EC signal level and the coarse comparators switches the control into the coarse mode. This "switch" connects the coarse error signal to the input of the servo amplifier 123 and connects the output of the servo amplifier 123 to the coarse drive motor 25.

Simultaneously, brake 116 and clutch 123 are released. The brake release allows the carriage 9 to move with respect to rail 10, and the clutch release disengages the fine or vernier motor 12, allowing the coarse motor 25 to drive the carriage. The acceleration of the carriage drive will be determined by the maximum output current of this servo amplifier 123. The final running speed will be determined by the maximum output voltage of this servo amplifier. The gain of the servo amplifier will normally be set sufficiently high so that the amplifier operates in either voltage or current limit until the carriage 9 has traveled to the approximate position of its stopping address. When this point is reached, the value of the coarse error signal will be low enough to allow the servo amplifier 123 to operate in its linear region. Since the mass of the carriage 9 will be quite large and the rolling friction small, braking will be required to decelerate it within the remaining distance of travel. This is done electrically by the servo amplifier 123. As the carriage 9 approaches its stopping address, the output voltage of the servo amplifier 123 will decrease faster than the back EMF of the coarse motor 25. This will cause the current to reverse direction and consequently, the torque at the shaft of the motor will reverse, causing the required braking. The amoung of reverse current is controlled by the amplifier and hence the rate of the deceleration is also controlled.

As the carriage 9 moves towards the stopping address, the coarse error signal decreases proportionately until it is less than the coarse tolerence $\Delta EC$. The coarse comparator 126 detects this level and switches to the fine positioning mode. the compare level, $\Delta EC$, will be selected so that the carriage 9 will have entered the range of the fine positioning sensor 120. This null position will be sensed at the output of the demodulator by a second fine comparator 127. When this output becomes less than a preset fine tolerance $\Delta EF$ signal level, the carriage 9 will have been driven to within the required tolerance of the stopping address, and the comparator 127 will switch to the stop mode. This switch includes turning on the brake 116 to lock the carriage 9 in the position on rail 10, and sending a pulse to the "Z-axis" motion mechanism to either pick up or put down a part which may be carried on the chuck 8. When the "Z" motion is completed, a switch closure on the mechanism will signal the control unit that the carriage move has been completed.

As indicated above, the Z-motion mechanism 117 is employed to load/unload work-pieces to and from input/output pedestals on the various processing sectors or stations e.g. 1A to 1F.

After the work handler or carriage 9 is positioned over the appropriate input/output station it is ready to start its load/unload cycle. When a work-piece is in the holder, it will be unloaded onto an input or load pedestal of the next specified processing sector or station; and when the carrier is not transporting a work-piece, it will be directed to an output pedestal of a sector and the work-piece at that point will be picked up by the handler for tranfer to another processing sector or station.

When the carriage is positioned and stationary at its specified address, the loading/unloading cycle is started by command to drive motor 143 which is connected to a one revolution clutch 142. The Z-motion mechanism is actuated during one revolution of the output shaft of drive motor 143 through a gear set 147 serving as an input to the cam index 147A which will revolve twice during the cycle as a result of the two to one ratio of gearing set 147. The output crank 148 will make up and down motion with appropriate dwell on the bottom of the stroke, and since the crank 148 is attached in slot 150 of slide block 151, the wafer chuck will be moved up and down on slide rods 149 so to place or remove a work-piece from the input or output pedestal station.

Figure 7:
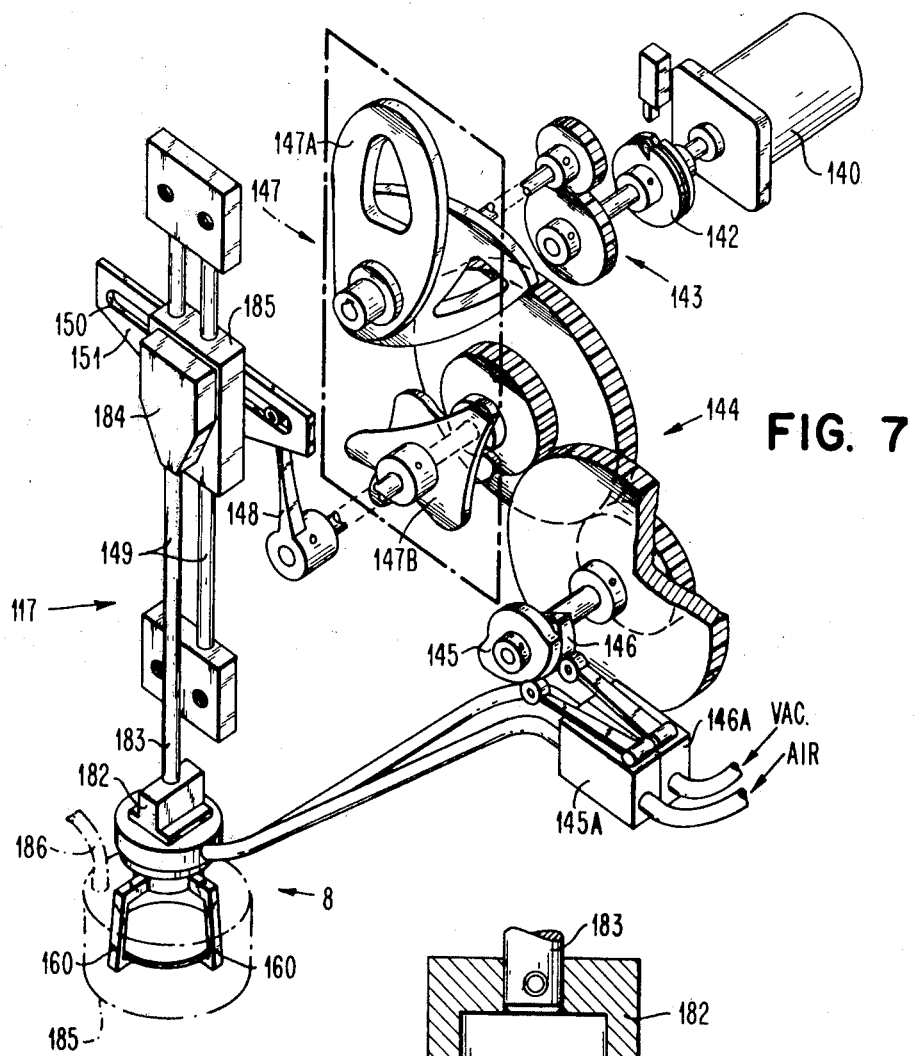
FIG. 7 is an exploded view illustrating details of a portion of a transport system to be employed for transfer of wafers between various semiconductor processing sectors.

Meanwhile during the up and down stroke, holder fingers 160 (see FIG. 7) are actuated to open or to close position as the case might be. Concurrently, the cams 145 and 146 make only one half of a revolution during the cycle due to a one to two ratio of gear set 144. Thus, the fingers 160 on holder or chuck 8 are opened or closed during the cycle. The timing of cams 145 and 146 will be such that the finger actuation is behind the down movement at the extreme bottom portion of the slide 150 to give time delay for actuation of the fingers 160 during the dwell of the indexer.

Actuation of the fingers 160 is effected by means of a rod 170 having an enlarged drive shoulder section 171 mounted within slots 172 of fingers 160 which will, as a result, be forced open and closed by movement of the cam rod 170 up and down. Secured about cam rod 170 is a piston 173 which will travel up and down within a bore 174 of cylinder block 175. The upper portion of the cylinder block is provided with a cylinder head 176 having a bore for reciprocation of the cam rod 170 therethrough. Secured at an upper portion of cam rod 170 is a retaining flange 177 for a return spring 178 contained against the cylinder head 176. An inlet for gas pressure into the cylinder space 179 is formed by a bore 180 whose outlet 181 is connected to a suitable source of gas pressure. Mounted on the cylinder block 175 is a bracket 182 having on which is secured an extending mounting rod 183 attached at its other end to a plate 184 which in turn is mounted to a slide block 185. If desired, a work-piece mounting rod 183 attached at its other end to a plate 184 which in turn is mounted to a slide block 185. If desired, a work-piece, such as a wafer, can be further supported on the inwardly extending portions of fingers 160 by provision of vacuum holes into each holder finger. Actuation of vacuum to the fingers and camming the fingers opened and closed is means of a cam 145 and 146 which suitably activate fluid valves 145A and 146A. The camming indexer 147 will comprise an indexer input 147A and an indexer output 147B. Also in the preferred mode the chuck 8 will include an environmental enclosure or cover 185 through which an environmental atmosphere can be injected via hose 186.

Normally, a plant erected to incorporate the manufacturing system of this mention will be under computer control, and be incorporated in the basic control system unit 112 of FIG. 4. In such an environment, any associated memory of the computer, e.g. tape or disc, may have entered into it a plurality of part programs consisting of a series of instructions specifiying the required operations of work-piece, together with the necessary process parameters within each processing sector as well as means for selfadaptive automatic processing within the sector or between processing sectors. In conjunction with specifying the required sequence of processing operations to be performed, the program will also specify a corresponding preselection of the sequence of processing sectors through which a work-piece must be processed to effect its desired total processing. Each part program will be identified by a part number, or other suitable codes which uniquely associates the series of operation to be performed with a particular part on which the operations are to be performed. In addition, the control system will include provision for the storage of additional part programs for a new part number, or modifications of existing part programs as required for existing part numbers.

To initiate operation, the control system is informed e.g. by an operator at a console or terminal of the part number to be processed whereby the file on the computer memory will be searched for the part program, associated with the part number, for transmittal to the control system. After transmittal of the part program to the control system the functional units of each processing sector will be activated to the status required for processing of the work-piece. In conjunction with the main control system, each sector can be provided with its own individual control for setting process parameters and for wafer flow within the sector. A sector may be operated as a stand-alone machine such that one can present a wafer at the input pedestal, and it will be processed through to the output pedestal, the sector controls providing for routing of the wafer through the process tubes in that sector as well as control of parameters within the sector, as for example, temperature, gas flows, etc. such as employed for semiconductor processing.

Each sector control system can communicate with the main control system, which can monitor sector-to-sector work-piece flow, provide adaptive control functions, and record required parametric data. In addition, the main control unit can communicate with those factory systems which support the functions of production control, design and process automation, quality testing, etc.

The control of process parameters, e.g., temperatures, flows, etc., can be acccomplished by standard analog or digital means. Selection of the particular method of control will normally be made on a basis of precision, reliability, cost, compatibility with the unit being controlled and other standard engineering considerations. In some cases, it may be desirable to have the main control system set the parameter levels. For example, in a semiconductor processing system, the setting of an etch time can be made a function of the thickness of material measured in the previous sector on the wafer. Override motor control may also be provided for parameter setting by the main control unit in such cases. In the absence of a signal from the main control unit, the local control (e.g. each sector) must refer to its nominal set point or remain at the set point indicated by the last available main control unit signal whichever is appropriate for the particular parameter of interest.

Monitoring of functions is also comprehended to insure that equipment failure will not result in catastrophic mishap and also to insure that the process is in control and product is made within allowable specification. The monitoring of process parameters can be done by the main control unit, using redundant sensing elements built into each sector, such that the same sensors will not be used for control of the parameter and for monitoring the parameter.

Also, the main control unit can compare critical parameter values against predetermined limits and when required, take appropriate action in accordance with techniques well known in the art, for notifying maintenance and inhibiting further entry of work-pieces to that sector.

At critical work-piece transfer points within a sector, a signal can be generated for the main control unit to enable it to monitor progress of work-pieces through the sector and to track individual work-pieces for part number control and for correlation of parameter and measurement data with individual work-piece final test results.

As indicated above among the important functions of such a control unit is for logistic control of work-pieces through the various sectors of the overall manufacturing system, e.g. specifying the manner in which the work-pieces are indexed through a specified sequence of selected processing sectors. A preferred approach for such logistic control of prescribed sequencing of work-pieces through the sectors is that disclosed and described in U.S. Pat. No. 3,845,286 and also assigned to the assignee of this application. The invention disclosed in this copending application comprehends various modes of operating manufacturing system of a transport system in the aforedescribed U.S. Pat. No. 3,850,105.

Figure 9:
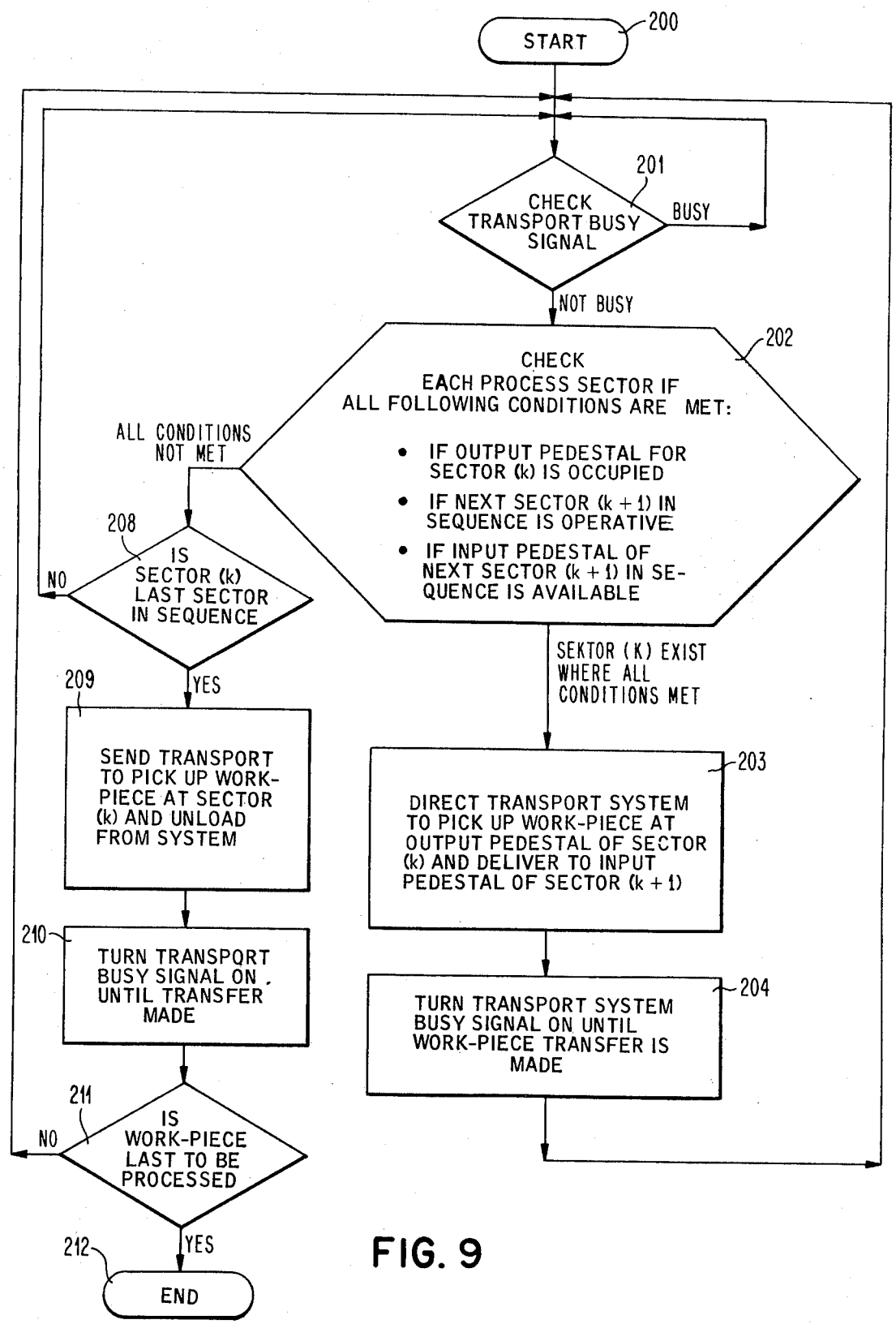
FIGS. 9 to 12b illustrate steps of control systems for various operating modes employed in the transport system of this invention.

In all modes of sequencing a work-piece, the logic of the control system is based on a fixed routing of the work-piece through all processing sectors for each part number of the work-pieces involved. Also, the logic of the movement of work-pieces between sectors is based on knowing the status of the input and output pedestals or positions of each processing sector. Therefore, the logic demands on an "output pedestal status" indicator for each sector and an "input pedestal status" indicator for each of these sectors. Also, the logic requires a "transport system status" indicator to reflect the unit's availability for movement of the work-pieces through the various processing sectors. Thus, the logic of the various modes of sequencing wafers is based on a continuous polling of the indicators, in such a way as to meet an objective of trying to keep each processing sector's input pedestal occupied by a wafer. The first mode comprehended in the aforesaid U.S. Pat. No. 3,845,286 relates to the sequencing of work-pieces through a preselected sequence of processing sectors all of which are dedicated to a specific portion of the overall process, and an individual work-piece will only visit such a sector only one time. FIG. 9 illustrates an outline of steps present in this mode of operation. Referring to FIG. 9, the first START Step 200 is employed to initiate the control system for sequencing the work-pieces through the processing sectors. On initiation, the system proceeds to Step 201 to determine if the transport system 2 is presently in the process of transferring a workpiece between sectors. If a negative determination is found for any one of those foregoing conditions (e.g. all conditions not met) at all sectors, the system at the last sector ($K+N$) will proceed to Step 208 to determine if the output or unload pedestal of this last sector ($K+n$) is occupied by a finished work-piece. On a negative determination in Step 208, the system will return to Step 201.

Conversely, if the determination of Step 208 is positive, indicating that the output position of the last sector ($k+n$) is occupied by a finished work-piece which can be unloaded out of the processing line, the control system as indicated in Step 209, will dispatch the transport system to output pedestal of the last sector ($K+n$) to pick up the workpiece and to unload it from the system, while as Step 210 concurrently, turning on the transport units busy indicator on until the move is made. On completion of the move, the system will proceed to Step 211 to determine if the last scheduled work-piece has been processed e.g. no further work-pieces are to be processed. On a positive determination, the system will proceed to stop Step 212 to terminate further operation of the control system; and if a negative determination is made, the control system will return to Step 201 sectors. If a position determination is made to the effect that transport system is at that time transporting a work-piece, the determination of Step 201 is repeated as necessary until the transport unit is found to be free.

If the transport system is found to be available, the control system will proceed to Step 202 for successively checking each of the processing sectors until a sector is found meeting all three of the following conditions:
1. If the output position pedestal for a sector (K) being checked is occupied by a work-piece;
2. If the next succeeding sector ($K+1$) in the prescribed sequence of sectors is operative; and
3. If the input pedestal of this next sector (K+1) in the sequence is available.

If a sector (K) is found which first meets all of the conditions specified in Step 202, the system proceeds to Step 203 where the transport system is directed to pick up a work-piece at the output pedestal of the sector (K) and to deliver it to the input pedestal of next processing sector ($K+1$) of the prescribed sequence of sectors. Concurrently, as indicated in Step 204, the system will turn the transport system busy signal on, which signal will be maintained until the work-piece transfer is made between the indicated processing sectors. On completion of the transfer, the transport busy signal will be turned off, with the control system proceeding to Step 201 for repeating the determination therein.

Figure 10B:
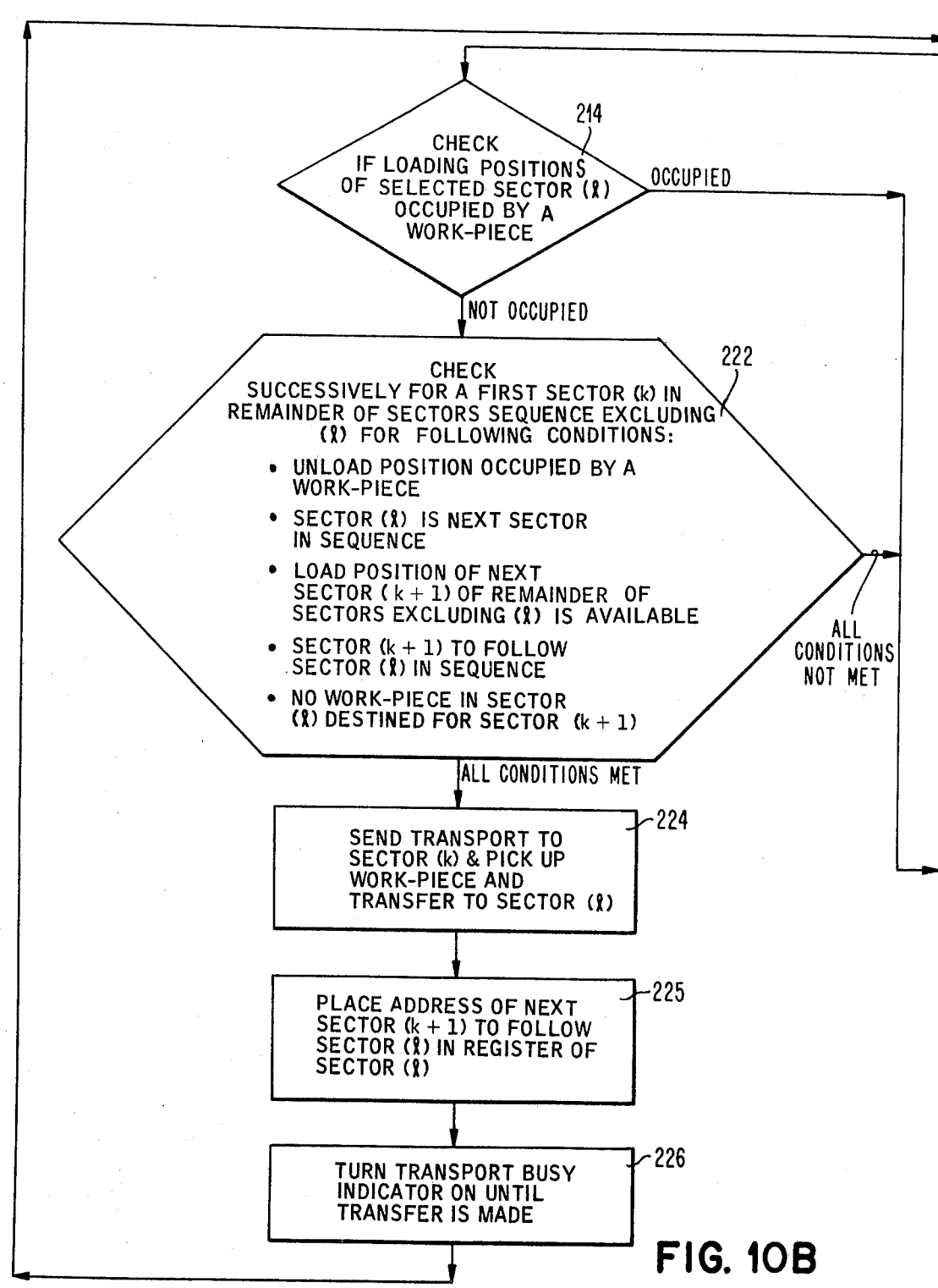
Figure 10C:
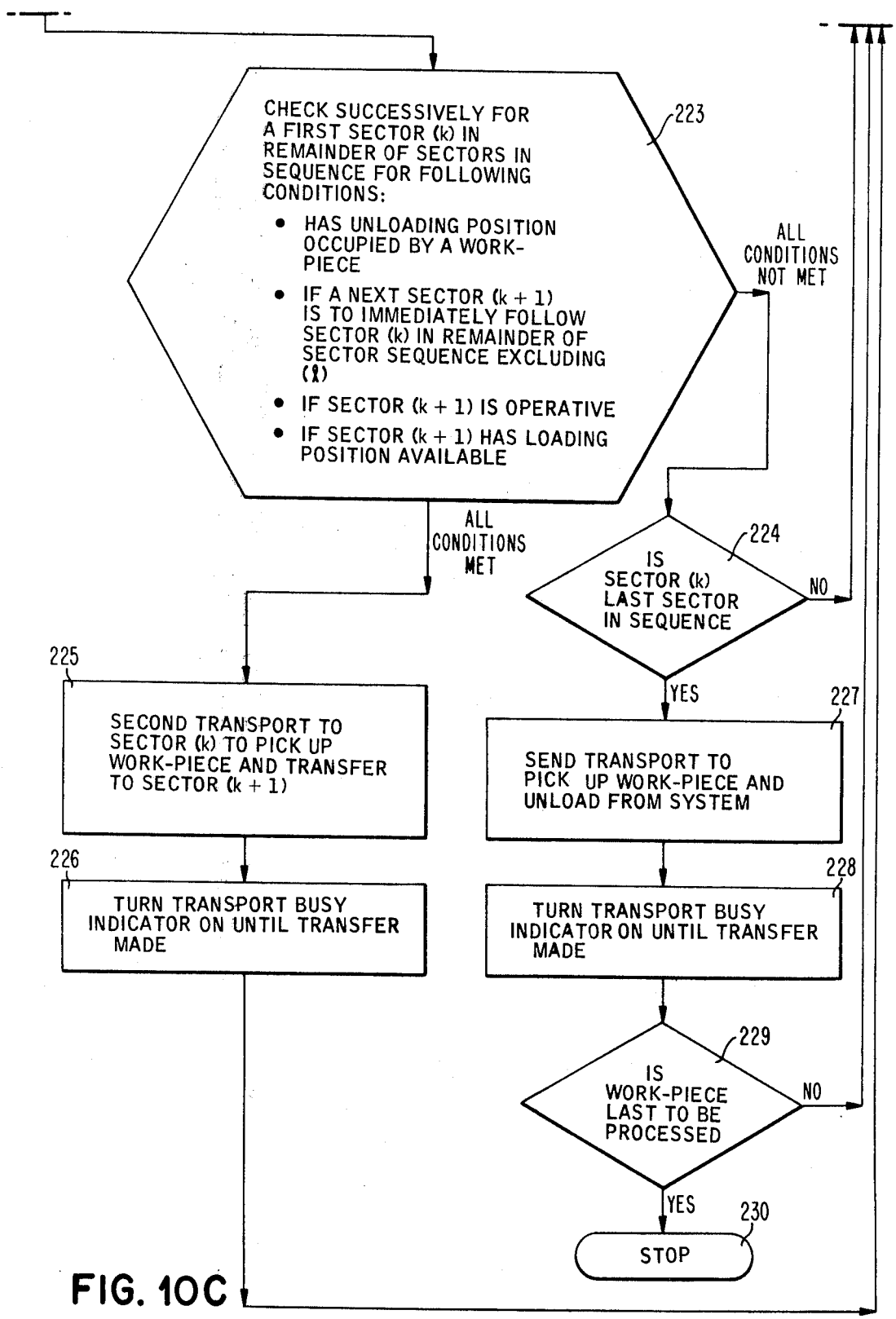

A second mode of operation comprehended in the said U.S. Pat. No. 3,845,286 is directed to the transfer of a workpiece to a plurality of processing sectors wherein is included selected processing sector (L) to which the workpiece is transferred at least twice either prior to transfer to another of the remaining processing sectors $K_x$ (e.g. $K$, $K+1$ ... $K+n$) or after leaving any of the other remaining processing sectors $K_x$. In this mode of operation, as illustrated in FIG. 10, the control operation system begins with a START Step 205 to inititate operation.

On initiation of the control system, it proceeds to Step 206 to check the transport busy signal, of its indicator, to see if the transport is presently transporting a work-piece between sector of the processing sectors. If the transport unit is presently transporting a work-piece, the determination of Step 206 is repeated until the transport unit is found to be available for transferring another work-piece, at which time it will proceed to Step 207. In Step 207 a check is made to determine if a work-piece is occupied by an output position of any selected sector (L) which is utilized twice for processing a work-piece therethrough in a prescribed sequence of operations. If an output station of a selected sector (L) is found ooccupied by a work-piece, the system proceeds to Step 213. However, if no output station of a selected sector (L) is occupied by a work-piece, the system proceeds to Step 214.

If a determination is made in Step 213 that the sector (L) is the last sector in the sequence required to process a work-piece, the system will proceed to Step 215 wherein the transport system is directed to the selected sector (L) to pick up the work-piece and to unload it from the system, while concurrently, as indicated by Step 216, turning the transport system busy signal on until the transfer is made to unload the work-piece from the processing system. In a subsequent Step 217 a determination is made to find if the work-piece being transferred is the last of a scheduled series to be processed. On a positive determination the system proceeds to stop Step 218 which terminates operation of the control system. However, if the termination of Step 217 is negative indicating that additional work-pieces are to be processed, the system returns to Step 206 to repeat the indicated determination thereof.

If the determination in Step 213 shows that the selected sector (L) is not the last sector in a specified sequence of processing sectors, the system moves to Step 219 to make determination if the input position is available to the next sector ($L+1$), which can include the sector K is specified in a destination register of the selected sector (L). If the determination is negative, the system will proceed to Step 214 which, as previously indicated, is also responsive to Step 207. Conversely, if the determination in Step 219 indicates that an input or load position is available in the next sector ($L+1$) the system will move to Step 220 which will dispatch the transfer system to pick up the work-piece at the output position of the selected sector (L) and transfer it to the input position of the next sector ($L+1$) whose address is specified in the destination register of the selected sector. Concurrently, as indicated in Step 221, the transport system's busy indicator will be turned on and maintained on until the transfer is made whereupon, the system returns to Step 206 for repeating the determination therein.

In Step 214 (repsonding to the determination of both Steps 207 and 219), a determination is made if a selected sector (L) has a loading or input position occupied by a work-piece. On a negative determination indicating that the loading position is not occupied, the system proceeds to Step 222, and conversely, on a positive finding that the loading position of a selected sector (L) is occupied by a work-piece, the system moves to Step 223.

In Step 222, each of the remaining sectors (in a prescribed sequence of sectors but excluding any selected sector (L)) are checked to find a first sector (K) meeting all of a plurality of conditions, to wit five conditions. Specifically, the first of the conditions is to determine if a processing sector (K) has its unload or output position occupied by a work-piece. Secondly, a determination is made if a selected sector (L) is to be the next sector to follow sector (K) in the prescribed sequence of processing sectors. The third condition determined is whether the load or input position of the next sector ($K+1$) (of the remainder of the sectors in the sequence excluding the selected sector (L)) is available. The fourth condition determination is whether the sector ($K+1$) is to follow a selected (L) in the sequence and finally, the fifth condition determined is whether there is no work-piece in a selected sector (L) destined for sector ($K+1$). For this fifth condition, a positive determination is made on a finding that yes there is no work-piece in the indicated selected sector (L). If all conditions of the determination of Step 222 are not met, the control system proceeds to Step 223, which as above indicated is also responsive to the determination of Step 214. If all the conditions of step 222 are met, the control system proceeds to Step 224 which will direct the transport system to proceed to the sector (K) where it will pick up a work-piece from its unload position and transfer it to the loading position of a selected sector (L). Concurrently, in Step 225 an address is placed in the destination register of the selected sector (L) indicating that sector ($K+1$) is to follow it in the sequence of processing sectors. Also, as indicated in Step 226 the transport busy signal indicator will be turned on and maintained on until the indicated transfer of the work-piece is made, whereupon the control system will return to Step 206 repeating the determination in this step.

In Step 223, a check is made of successive processing sectors $K_x$ excluding the selected sectors (L)) to find a first sector (K) which first meets all of the four following condtions. The first condition to be met is whether a processing sector (K) has an unloading or output position occupied by a work-piece. A second condition to determination of the existence of succeeding sector ($K+1$) to immediately follow the sector (K) in the sector sequence. The third condition is a determination if the next sector (K+1) is operative, and whether the sector ($K+1$) has a loading or input position available to receive a work-piece. If no processing sector (K) is found meeting all conditions, the control system proceeds to Step 224. Conversely, on finding of a processing sector (K) first meeting all conditions specified in Step 223, the control system proceeds to Step 225 which directs the transport system to proceed to the unloading position of the sector (K) to pick up a work-piece and transfer it to the loading position of the sector ($K+1$). Concurrently, as indicated in Step 226, the control system will have its busy indicator turned on in which condition it will be maintained until the transfer of the work-piece. Upon completion of the transfer, the control system will return to Step 206 for repeating the determination therein. concurrently As indicated above, if the determination of Step 223 indicates the absence of any processing sector (K) meeting the conditions specified the control system will then proceed to Step 224 which determines whether any processing sector (K), excluding any selected sector (L), is the last sector in the prescribed sequence of processing sectors. If the determination is negative, the control system will return to Step 206 for repeating the determination therein. Conversely, if the determination is positive, the control system will proceed to Step 227 which will direct the transport system to proceed to the output station of the processing sector (K) for purposes of unloading the work-piece from the manufacturing system while concurrently turning on the busy indicator of the transport system, which condition will be maintained until the transfer is made, as indicated in Step 228. In the next operation, the control system proceeds to Step 229 for purposes of determining if the work-piece transfer is the last of a series to be processed. If the determination is negative, the control system returns to Step 206 for again repeating the determination therein, while the work-piece is the final one of a series to be processed the control system proceeds to Step 230 to suspend the operation of the control system.

Figure 11B:
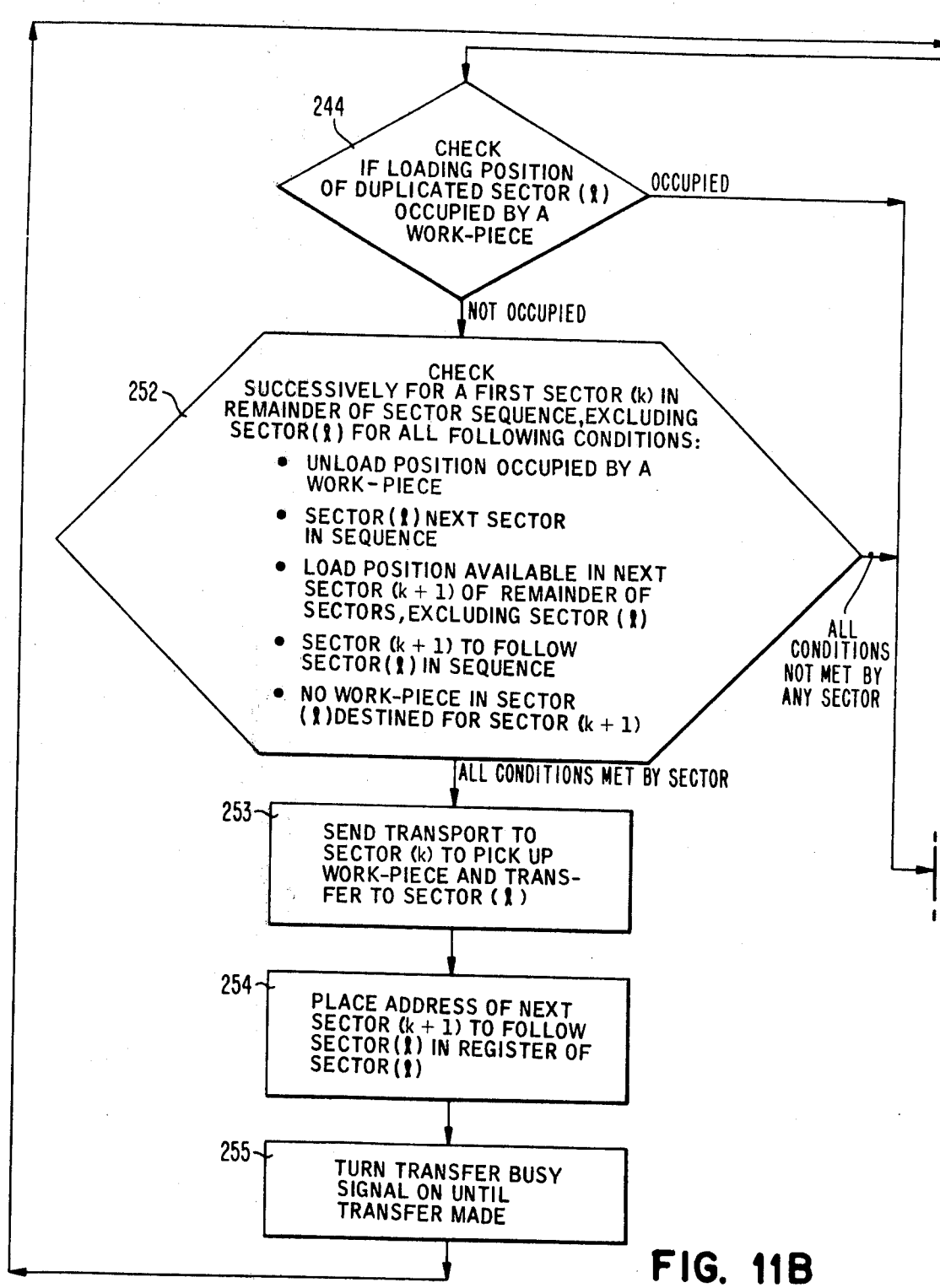
Figure 11C:
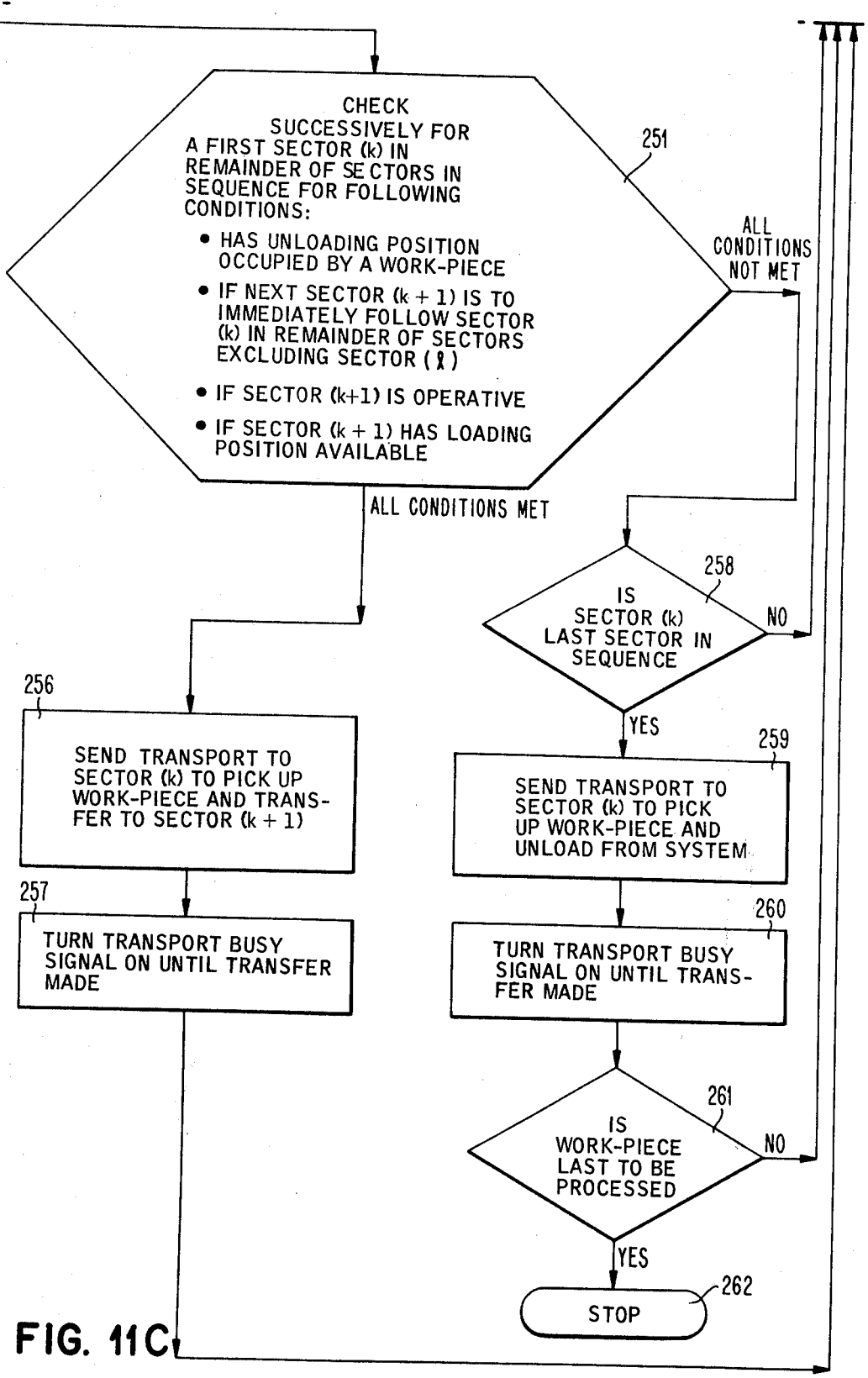

FIG. 11 illustrates a control system for use with the manufacturing system of the aforesaid U.S. Pat. No. 3,850,105 when at least two of the processing sectors are duplicated to have substantially similar operations, as exemplified by the use of two photoresist pattern generator units 6 in FIG. 1 when the system is adapted for processing of semiconductor devices. In this mode of operation, the system is initiated at Step 240 which begins operation. When the system is initiated, it proceeds to Step 241 to determine if transport system is busy supporting work-piece in transfer between processing sectors. If the transport system is found busy, Step 241 is iterated until the transport system is found to be available, at which time the operation proceeds to Step 242. In Step 242 a check is made of the input positions of the duplicated sectors (L) until a first work-piece present signal is found or until all duplicated sectors have been checked. If an output position of a duplicated sector (L) is found occupied by a work-piece, the operation of control system will proceed to Step 243. Conversely, if none of the output position of the duplicated sectors is found occupied by a work-piece, the control system will proceed to Step 244.

In Step 243, a determination is made whether any of the duplicated sectors (L) is the last sector in a prescribed sector sequence. If a determination is made that a duplicated sector (L) is the last sector of the sequence, the system will proceed to Step 245, whereas if it is found that no duplicated sector (L) is the last sector in the sequence, the control system will proceed to Step 246. In response to a finding in Step 243 that a duplicated sector (L) is the last sector in a sequence of processing operations, Step 245 will direct the transport system to proceed to the duplicated sector (L), in point, to pick up the work-piece and proceed to unload it from the system, while concurrently, in Step 247 turning on the transport busy signal indicator on in which condition it will be maintained until the work-piece is unloaded from the system. On completion of the operation of Step 247, the control system will proceed to Step 248 where a determination is made as to whether the work-piece unloaded is the last one of a scheduled series to be processed through the various processing sectors. If the determination of Step 248 is positive, the system will proceed to Step 249 to terminate operation of the control system. Conversely, if the finding of Step 248 is negative, the control system will return to Step 241 for repeating the determination specified in this operation.

As indicated above, if the determination of Step 243 is that the duplicated sector (L) is not the last sector in the sequence, Step 246 will make a determination if an input or load position is available in a processing sector ($L+1$) which is to follow the operation in a duplicated sector (L) in the specified sequence of processing sectors. Normally, each duplicated sector (L) will have a destination register associated with it in which the address of the next processing sectors, will be placed.

sector ($L+1$) of the prescribed sequence of processing sectors, the control register.

If a negative determination is made in Step 246 indicating that the input position of the following sector ($L+1$) is not available, the control system will proceed to Step 244, which as indicated above is also responsive to a negative determination made in Step 242. On a positive determination Step 246, that an input position is available in the following sector ($L+1$) of the prescribed sequence of processing sectors, the control system will proceed to Step 250 wherein the transport system will be directed to pick up a work-piece, at the output position of the duplicated sector (L) and to drop it off at the input position of the following sector ($L+1$) whose address is specified by the contents of the duplicated sector (L)'s destination register. Concurrently, Step 251 will direct the transport system to have its busy indicator turned on, which condition will be maintained until transfer of the work-piece is made, following which, the control system will return to Step 241 for repeating the determination indicated therefore.

On a finding in Step 242 that no output or unload position of a duplicated sector (L) is occupied by a work-piece for transfer, or if occupied by a work-piece that no transfer is possible as determined in Step 246, the control system will proceed to Step 244 where a determination is made if an input or loading position of a duplicated sector (L) is occupied by a work-piece. If a positive determination is made in Step 244 that an input position of a duplicated sector (L) is occupied by a work-piece, the control system will proceed to Step 251.

When an input position of a duplicated sector (L) is found, in Step 244, to be available to receive a work-piece, a determination is made in Step 252 at successive ones of each of the remaining sectors, excluding duplicated sectors, to find a first of these sectors (K) which meets each of five conditions. The first of these conditions is whether the sector (K) has an output or unload position occupied by a work-piece for transfer to another sector. The second condition is whether one of the duplicated sectors (L) is to be the next sector specified in the prescribed sequence of processing operations, and whether an input or load position of a next sector ($K+1$) of the remainder of sectors in a sequence (excluding the duplicated sectors) is available to receive a work-piece, and whether the sector ($K+1$) is to follow a duplicated sector (L) in the prescribed sequence of processing operation. In addition a determination is also made as to the absence of a work-piece in a duplicated sector (L) destined for transfer to the sector ($K+1$). If no processing sector excluding the duplicated sectors, is found meeting any of the conditions specified in the Step 252, the control system will proceed to Step 251. On a location of a sector (K) first meeting all the conditions specified in Step 252, the control system will proceed to Step 253, which directs a transport system to the processing sector (K) to pick up the work-piece at the output or unload position thereof and transfer it to the duplicate sector (L), while at the same time, by Step 254 placing the address of the next sector ($K+1$) which is to follow the sector (L) in the destination register thereof. Concurrently, by Step 255 the transport busy indicator signal will be turned on and maintained in this condition until the indicated transfer of the work-piece is made, whereupon the control system will return to Step 241 to repeat the determination specified therefore. On a positive determination of Step 244 and a negative determination of Step 252 the control system as indicated above will proceed to Step 251.

In Step 251 each of the remainder of processing sectors (K) excluding the duplicated sectors, of the specified sequence of processing sectors will be checked to find a first sector (K) meeting each of four conditions. The first condition is whether a sector (K) has an output or unloading position occupied by a work-piece for transfer to another sector. Also, whether the next sector ($K+1$) is to immediately follow the sector (K). Another condition is whether the following sector ($K+1$) is operative, and finally, whether the next sector ($K+1$) to follow sector (K) has an input or loading position available to receive a work-piece. If no sector is found meeting all the conditions specified in Step 242, the control system will proceed to Step 258. However, when the first sector (K) is found meeting all conditions specified in Step 251, the control system will proceed to Step 256 where the transport system will be dispatched to the output position of processing sector (K) where it will pick up the work-piece and transfer it to the input position of the following sector ($K+1$) while concurrently turning on, in Step 257, the transport busy signal on until the indicator transfer of the work-pieces made, after which the control system will return to Step 241 to again renew the determination specified therefore.

In Step 258, in response to a determination that no processing sector (excluding the duplicated sectors) in the prescribed sequence of sectors meets all the conditions specified in Step 251, a determination is made as to whether any sector (K) is the last sector specified in the sequence of processing operations. On a negative determination in Step 258, the control system will return to Step 241, whereas on a positive determination, a Step 258, the control system will proceed to Step 259 wherein the transport system will be directed to the output or unloading position of the sector (K) in order to pick up the work-piece and to unload from the system, while at the same time turning on the transport proceeding indicator signal on until the workpiece is the last unit of a series to be processed, as indicated in Step 261, the control system will again return to Step 241 to repeat its determination. On a negative determination in Step 261, the control system will again return to Step 241 to repeat its determination. On a positive determination in Step 261 that the work-piece is in fact the last of the series scheduled to be processed, the control system will proceed to Step 262 which will terminate operation of the control system.

Figure 12A:
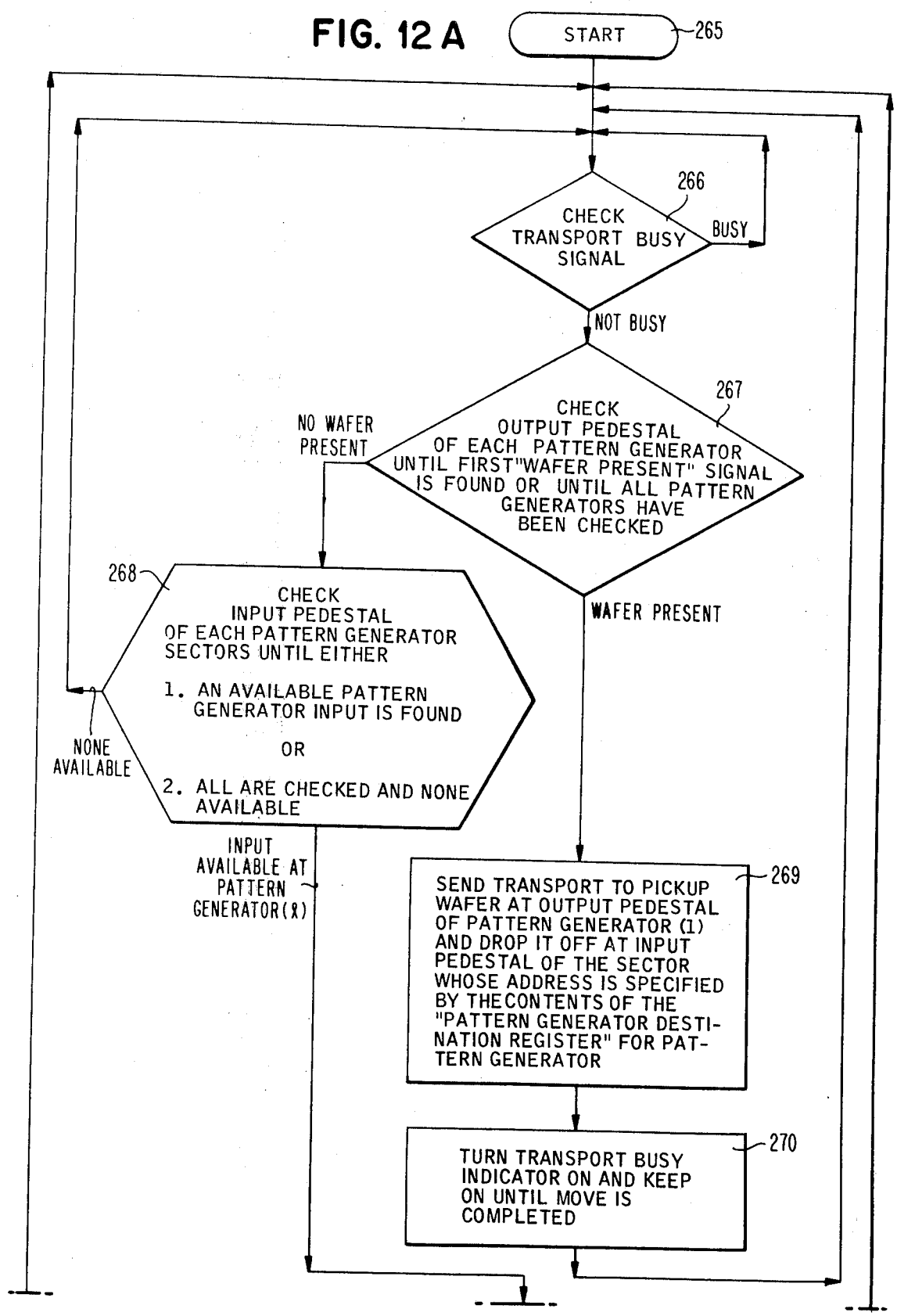
Figure 12B:
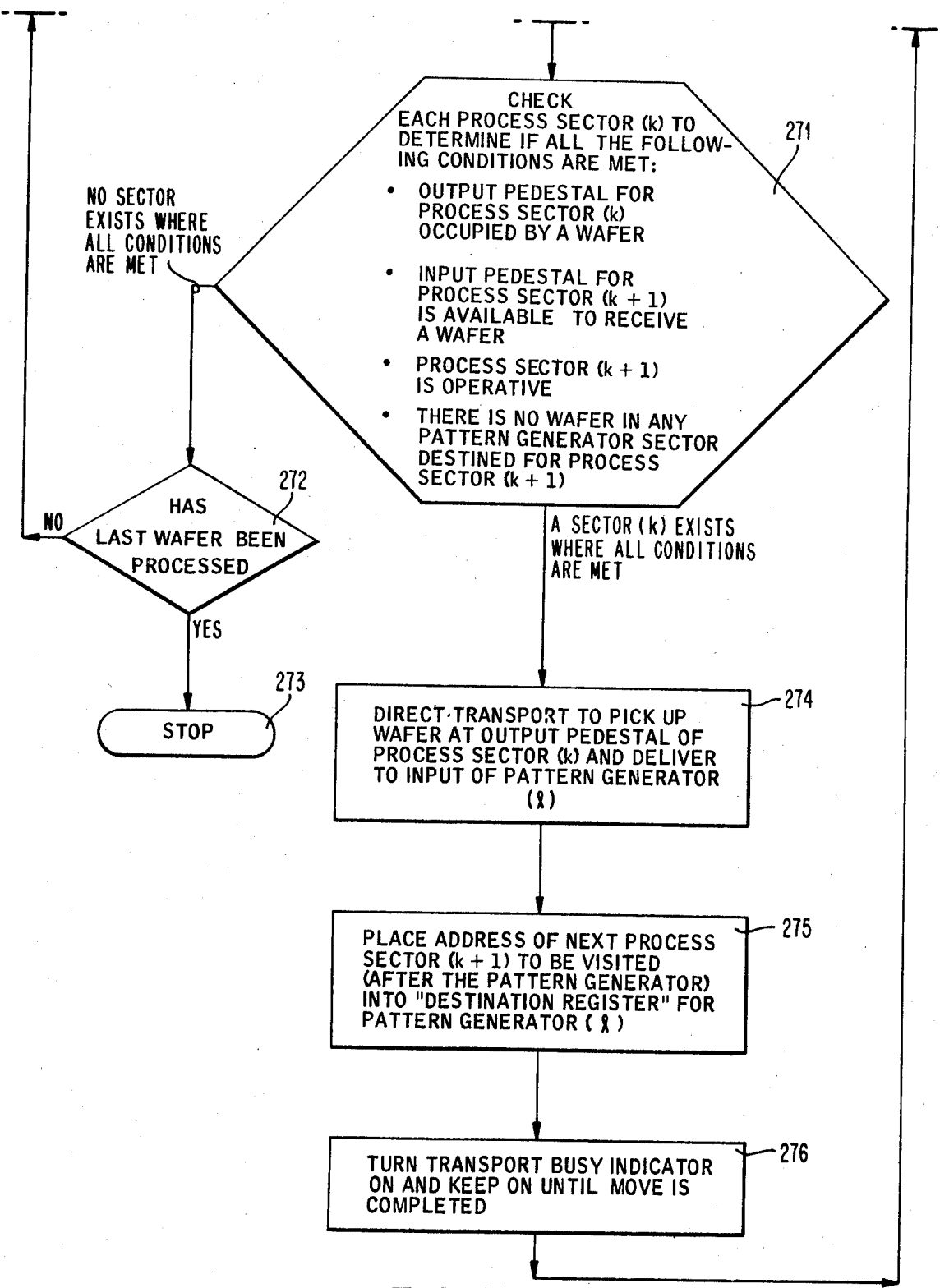

FIG. 12 illustrates the adaptation of the control system of FIG. 11 to the processing of the above indicated field effect transistor devices as applied to FIG. 1. As previously noted, such a field effect transistor manufacturing system will comprise, with reference to FIG. 1, and an oxidation sector 1A, a source of drain fabricating sector 1B, a gate oxidation sector 1C, two pattern generating units 6 as grouped within a resist exposure sector 1D, a metallization sector 1E, and a sintering sector 1F. For purposes of illustration, the various processing sectors will be classified into two categories. In the first category will be the first group of sectors referred to as pattern generating sectors (e.g. pattern generating unit 6) which will be re-visited by semiconductor wafers after the wafers leave other of the remainder of processing sectors. The general term "processing sectors" will be applied to the remainder of the sectors, excluding the pattern generating sectors. Thus, for the purpose of this explanation, the manufacturing system will contain processing sectors, e.g. 1A, 1B, 1C, 1E and 1F and also, pattern generating sectors as represented by pattern generating units 6. In operation, a fixed routing will exist (e.g. all wafers to follow the same path through all sectors) with the routing alternating between visits to a processing sector and to a pattern generating sector. In addition, as indicated previously, each of the various sector times will have an input pedestal and an output pedestal.

The logic of moving wafers between the various sectors is based on knowing the status of these input and output pedestals, and in the special case of delivering of a wafer to a pattern generating unit 6, remembering what sector that wafer is destined for upon exist of the pattern generating units. Therefore, the logic of the control system depends upon an "output pedestal status" indicator for each sector and an "input pedestal status" indicator for each sector. Additionally, a "pattern generator destination register" is maintained which represents the address of the sector to which a wafer must be sent upon existing from a specific pattern generator unit 6. Also, a transport "indicator is maintained to reflect the availability of the transport to do work." The logic of the control system of FIG. 18 is based on a continuous polling of the indicators mentioned above in such a way that an objective of trying to keep each of the various sectors input pedestal occupied by a wafer will be met. The strategy of control system is based on a continuous polling of the transport systems busy indicator until a "not busy" signal is found. Also, the first priority move of this system is to exit wafers from a pattern generator unit 6 following which the system will look for other moves for the wafers.

Initiation of the control system begins in START Step 265, following which the system proceeds to Step 266 to determine if the transport system busy signal is on. If the transport busy signal is on, the determination of Step 266 is repeated until the transport system is found available whereupon the control system will proceed to Step 267.

In Step 267, a check is made of the output pedestal status indicator of each of the pattern generating units 6 in turn until a "wafer present" indication is found. If the determination in Step 267 indicates that no output position of pattern generator unit 6 is occupied by a wafer, the control system will proceed to Step 268. Conversely, if the determination of Step 267 shows that a wafer is present at an output pedestal of a pattern generating unit 6. then the control system will proceed to Step 269 wherein the transport system will be directed to pick up the wafer at the output pedestal of the sector where wafer presence was noted, with the delivery of the wafer to the input pedestal of the next processing sector indicated in the "pattern generators destination register" associated with the pattern generating unit which is indicating a "wafer present" signal. Concurrently, as indicated in Step 270 this will cause the transport busy signal to be turned on until the move is completed whereupon the control system will return to Step 266 for repeating the determination therein.

In Step 268, a check is made of the "input pedestal status" of each pattern generating sector or unit 6 in turn. until an "available" pattern generating input pedestal is found, e.g. a pattern generating unit 6 having an input pedestal free of a wafer. If the determination of Step 268 indicates that there is no available pattern generating input pedestal, then the control system will return to Step 266 for repeating the determination indicated therefore. Conversely, if the determination of Step 268 indicates the existence of available input pedestal of a pattern generating unit 6, the control system will proceed to Step 271.

With respect to Steps 267 and 268 and 271 it may be noted that priority scheduling in the control system is accomplished only a a "type breaker", that is, if more than one move is possible at any instant in time, the polling sequence dictates the priority. Also with respect to Step 269 it may be noted that it is not necessary to check the status of the receiving sectors input pedestal since a wafer would not have been sent to any pattern generating unit 6 if the next sectors input pedestal were occupied.

In Step 271, to the exclusion of pattern generating sectors 6, each remaining process sector (K), (where K equals K, K+1, K+2 ... K+n), is checked for the existence of each of four conditions. The first condition to be determined in Step 271 is repeated for the next process sector (K+1). If a wafer is found to be present on the output pedestal of a process sector (K) then the determination is made on the presence for the existence of three additional conditions. These conditions include the determination as to the status of the next process sector (K+1) to which the wafer is to be transferred via a pattern generating unit 6. For this purpose a determination is made whether the pedestal of a processing sector (K+1) is available to receive a wafer, as well as a determination whether this sector (K+1) is operational. In addition a determination is made as to the absence of any wafer in any pattern generating unit 6 destined for sector (K+1). As indicated previously if the above conditions are not met by a sector, then the determination of Step 271 is repeated through successive sectors. If the determination of Step 271 shows that no sector exists which meets all the conditions specified for this step, then the control system will proceed to Step 272 wherein a determination will be made whether or not the last wafer in a series has been processed. If the determination in Step 272 is postiive, then the system will proceed to Step 273 to terminate operation. Conversely, if the determination of Step 272 is negative, then the control system will return to Step 266 to repeat the determination therein.

If the determination of Step 271 shows that a sector (K) exists where all conditions specified in this determination are met, the control system will proceed to Step 274 where the transport system will be directed to pick up the wafer at the output pedestal of a sector (K) for delivery of jt to the pattern generating unit 6 whose input pedestal was noted to be available in Step 268. Also Step 275 will concurrently place the address of the next processing sector (K+1) to which the wafer is to be subsequently transferred into the pattern generator destination register associated with the pattern generator to which the wafer has been moved. In addition, as indicated in Step 276, the transport system busy indicator will be turned on until the wafer move is completed where upon the control system will return to Step 266 for again repeating the determination therein.

While the invention has been particularly shown and described with reference to a preferred embodiment thereof, it will be understood by those skilled in the art that the foregoing and other changes in form and details may be made therein without departing from the spirit and scope of the invention.

What is claimed is:

1. Apparatus for positioning a moveable member comprising:
   A. track means for controlling the path of said moveable member along a predetermined path;
   B. means on said member for reversibly driving thereof along said path through and to any one of a plurality of locations thereon;
   C. means on said member for continuously generating a first analog signal representing the location of said memver along any point of said path including any point between and at said locations;
   D. means for generating a second analog signal corresponding to a specified new location for said member along said path;
   E. means for continuously generating a difference signal, from said first and second signals representative of the distance and direction of said member from and to, respectively, said new location with said drive means responsive thereto for moving said member to said new location;
   F. means to stop said member at said desired location;
   G. wherein said second signal generating means comprises an address circuit means for generating a digitally coded electrical signal specifying a said desired new location for said member, and converting said digitally coded signal to a representative said second analog signal;
   H. wherein said first signal generating means comprises a motion sensing means coupled to said drive means for continuously producing said first analog signal representing the position of said member along any point of said path;
   I. wherein said summing means comprises a summing amplifier for generating said difference signal;
   j. means for generating a tolerance signal representing permissible deviation of said member from coincidence with a said desired location;
   K. means for comparing said difference signal with said tolerance signal and generating a coincidence signal therebetween;
   L. means responsive to said coincidence signal to activate said stopping means;
   m. wherein said activating means comprises means for generating a fine tolerance signal representing a smaller permissible deviation of said member from coincidence with said specified location;
   n. position representing stop means comprising a magnet at each said desired location along said path;
   O. means on said member for sensing said magnet and generate a fine difference signal therebetween;
   P. means for comparing said fine difference signal with said fine signal and on coincidence therebetween generating a stop signal for said drive means;
   Q. wherein said drive means comprises a coarse motor means responsive to the first said difference signal of said summing amplifier and a fine motor means responsive to said fine difference signal;
   R. a drive mechanism for said reversible driving of said member; and
   S. a clutch means for interchangeable engaging said drive mechanism between said coarse and fine motor means in response, respectively, to the absence and presence of said coincidence signal; wherein T. said stop means comprises brake means for stopping said member in response to said stop signal;

U. wherein said drive mechanism includes a pinion meshed with a rack on said track means;

V. wherein said moveable member includes a carrier head for supporting articles during movement of said member; and W. transfer means for depositing and removing articles on said carrier head, from and to, respectively, specified ones of said locations, adjacent said path, when said member is directed thereto.

2. The apparatus of claim 1 including means for actuating said transfer means on generation of said stop signal 3. Apparatus for positioning a moveable member comprising:

A. track means for controlling the path of said moveable member along a predetermined path;

B. means on said member for reversibly driving thereof along said path through and to any one of a plurality of locations thereon;

C. means on said member for continuously generating a first analog signal representing the location of said member along any point of said path including any point between and at said locations;

D. means for generating a second analog signal corresponding to a specified new location for said member along said path;

E. means for continuously generating a difference signal, from said first and second signals, representative of the distance and direction of said member from and to, respectively, said new location with said drive means responsive thereto for moving said member to said new location;

F. means to stop said member at said desired location;

G. wherein said second signal generating means comprises an address circuit means for generating a digitally coded electrical signal specifying a said desired new location for said member, and for converting said digitally coded signal to a representative said second analog signal;

H. wherein said first signal generating means comprises a motion sensing means coupled to said drive means for continuously producing said first analog signal representing the position of said member along any point of said path;

I. wherein said summing means comprises a summing amplifier for generating said difference signal; and J. including means for generating a tolerance signal representing permissible deviatiion of said member from coincidence with a said desired location;

K. means for comparing said difference signal with said tolerance signal and generating a coincidence signal therebetween; and L. means responsive to said coincidence signal to activate said stopping means;

M. wherein said activating means comprises means for generating a fine tolerance signal representing a smaller permissible deviation of said member from coincidence with said specified location; and including N. position representing stop means comprising a magnet at each said desired location along said path;

O. means on said member for sensing said magnet and generate a fine difference signal therebetween; and P. means for comparing said fine difference signal with said fine signal and on coincidence therebetween generating a stop signal for said drive means. wherein Q. said moveable member includes a carrier head for supporting articles during movement of said member, and R. transfer means for depositing and removing articles on said carrier head, from and to, respectively, specified ones of said locations, adjacent said path, when said member is directed thereto.

4. The apparatus of claim 3 including means for actuating said transfer means on generation of said stop signal.

5. Apparatus for positioning a moveable member comprising:

A. track means for controlling the path of said moveable member along a predetermined path;

B. means on said member for reversibly driving thereof along said path through and to any one of a plurality of locations thereon;

C. means on said member for continuously generating a first analog signal representing the location of said member along any point of said path including any point between and at said locations;

D. means for generating a second analog signal corresponding to a specified new location for said member along said path;

E. means for generating a difference signal, from said first and second signals representative of the distance and direction of said member from and to, respectively, said new location with said drive means responsive thereto for moving said member to said new location;

F. means to stop said member at said desired location;

G. wherein said second signal generating means comprises an address circuit means for generating a digitally coded electrical signal specifying a said desired new location for said member, and for converting said digitally coded signal to a representative said second analog signal;

H. wherein said first signal generating means comprises a motion sensing means coupled to said drive means for continuously producing said first analog signal representing the position of said member along any point of said path;

I. wherein said summing means comprises a summing amplifier for generating said difference signal; and J. including means for generating a tolerance signal representing permissible deviation of said member from coincidence with a said desired location;

K. means for comparing said difference signal with said tolerance signal and generating a coincidence signal therebetween; and L. means responsive to said coincidence signal to activate said stopping means M. wherein said activating means comprises means for generating a fine tolerance signal representing a smaller permissible deviation of said member from coincidence with said specified location;

n. including position representing stop means comprising a magnet at each said desired location along said path;

O. means on said member for sensing said magnet and generate a fine difference signal therebetween;
P. means for comparing said fine difference signal with said fine signal and on coincidence therebetween generating a stop signal for said drive means;
Q. wherein said drive means comprises a coarse motor means responsive to the first said difference signal of said summing amplifier and a fine motor means responsive to said fine difference signal;
R. a drive mechanism for said reversible driving of said member; and
S. a clutch means for interchangeably engaging said drive mechanism between said coarse and fine motor means in response, respectively, to the absence and presence of said coincidence signal; wherein
T. said stop means comprises brake means for stopping said member in response to said stop signal wherein
U. said moveable member includes a carrier head for supporting articles during movement of said member; and
V. transfer means for depositing and removing articles on said carrier head, from and to, respectively, specified ones of said locations, adjacent said path, when said member is directed thereto.

6. The apparatus of claim 5 including means for actuating said transfer means on generation of said stop signal.

* * * * *